(12) United States Patent  (10) Patent No.: US 7,598,756 B2
Inoue et al.  (45) Date of Patent: Oct. 6, 2009

(54) INSPECTION DEVICE AND INSPECTION METHOD

(75) Inventors: Keisuke Inoue, Kyoto (JP); Nobuhiro Katsuma, Shiga (JP); Seiichi Kageyama, Kyoto (JP); Masanori Hamada, Osaka (JP); Takashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/600,149

(22) Filed: Nov. 16, 2006

(65) Prior Publication Data

US 2007/0109000 A1 May 17, 2007

(30) Foreign Application Priority Data

Nov. 16, 2005 (JP) ............................. 2005-330922
Oct. 20, 2006 (JP) ............................. 2006-285605

(51) Int. Cl.
G01R 31/02 (2006.01)
(52) U.S. Cl. ........................................ 324/754; 324/761
(58) Field of Classification Search .......... 324/754–765
See application file for complete search history.

(56) References Cited

U.S. PATENT DOCUMENTS 3,866,119 A * 2/1975 Ardezzone et al. .......... 324/754
4,567,432 A * 1/1986 Buol et al. ................. 324/760
5,109,596 A * 5/1992 Driller et al. ................ 29/705
5,672,978 A * 9/1997 Kimura ...................... 324/754
6,359,452 B1 * 3/2002 Mozzetta .................... 324/754
6,720,787 B2 * 4/2004 Kimura et al. .............. 324/765
7,088,118 B2 * 8/2006 Liu et al. .................... 324/754
7,262,615 B2 * 8/2007 Cheng et al. ................ 324/755
2007/0001701 A1 * 1/2007 Kimura et al. .............. 324/765

FOREIGN PATENT DOCUMENTS

JP          2001208793 A     8/2001

* cited by examiner

*Primary Examiner*—Ha Tran T Nguyen
*Assistant Examiner*—Joshua Benitez
(74) *Attorney, Agent, or Firm*—Steptoe & Johnson LLP

(57) ABSTRACT

A first conductive contact connecting a first electrode of an inspection circuit board and one external electrode of a semiconductor integrated circuit is arranged in a fixed member. A second conductive contact connecting a second electrode of a wiring board and the other external electrode of the semiconductor integrated circuit is arranged in a movable member. A third conductive contact connecting one third electrode of the inspection circuit board and the other third electrode of the wiring board is arranged in the movable member. The other third electrode is connected to the second electrode. When the movable member moves to the contacting position, the second conductive contact makes contact with the other external electrode, and the third conductive contact makes contact with the one third electrode.

8 Claims, 18 Drawing Sheets

INSPECTION DEVICE AND INSPECTION METHOD

FIELD OF THE INVENTION

The present invention relates to an inspection device and inspection method for measuring and inspecting electric characteristics of a semiconductor integrated circuit having electrodes on two opposite faces thereof, by use of a measuring device.

BACKGROUND OF THE INVENTION

When electric characteristics of a semiconductor integrated circuit are inspected, there is generally used an inspection device electrically connecting an external electrode of the semiconductor integrated circuit to a measuring device and performing inspection. As a prior art inspection device, there is an inspection device 82 using a pogopin type (spring-incorporating contact pin) conductive contact 81 illustrated in FIG. 20.

The pogopin type conductive contact 81 has arranged in the interior of a cylinder body 83 thereof a coil-shaped compression spring 84, one plunger 85 and the other plunger 86. A tip end of the one plunger 85 protrudes upward from the cylinder body 83 in an advanceable and retractable manner; a tip end of the other plunger 86 protrudes downward from the cylinder body 83 in an advanceable and retractable manner. The compression spring 84 is arranged between the one plunger 85 and the other plunger 86, urging the two plungers 85 and 86 in a protruding direction.

By means of expansion and contraction of the compression spring 84, the one plunger 85 is pressed against an external electrode 88 of a semiconductor integrated circuit 87 and at the same time, the other plunger 86 is pressed against a land electrode 91 of an inspection circuit board 90 connected to a measuring device 89. Consequently, the external electrode 88 and the land electrode 91 are electrically connected through the two plungers 85 and 86 and the cylinder body 83.

The inspection circuit board 90 is arranged in one direction relative to the semiconductor integrated circuit 87, i.e., in a direction opposite to a face where the external electrode 88 is formed. The reason for this is to electrically connect the external electrode 88 and land electrode 91 at a shortest distance by use of the conductive contact 81.

In recent years, with increasing requests for high density of semiconductor integrated circuit, in order to allow a package-on-package (hereinafter, POP for short) structure stacking semiconductor integrated circuits after assembly, there have been developed as a new semiconductor integrated circuit package configuration, semiconductor integrated circuits having electrodes on each of the two opposite faces thereof; thus, an inspection device capable of handling such semiconductor integrated circuit structure is required. Also, as the operating speed of electric signal between the stacked semiconductor integrated circuits increases, as for the inspection device, improvement in electric performance, i.e., loss reduction of transmission path is required.

In Japanese Patent Laid-Open No. 2001-208793, there is described an inspection device for a semiconductor integrated circuit provided with a pogopin type (spring-incorporating contact pin) conductive contact.

However, as illustrated in FIG. 21, when the inspection device 82 described above is used for an electric characteristics inspection of the semiconductor integrated circuit 87 having external electrodes 88a and 88b on two opposite faces 87a and 87b, the following problem arises.

In the prior art inspection device 82, the inspection circuit board 90 is arranged in one direction relative to the semiconductor integrated circuit 87. Accordingly, when the external electrode 88a on the one face 87a of the semiconductor integrated circuit 87 is placed in a manner facing the inspection circuit board 90, it is difficult to electrically connect the external electrode 88b on the other face 87b of the semiconductor integrated circuit 87 and the land electrode 91 of the inspection circuit board 90.

Thus, as illustrated in FIG. 22, in the one face 87a of the semiconductor integrated circuit 87, there is additionally provided a plurality of inspection-use external electrodes 93 connected to the external electrode 88b on the other face 87b through the interior of the board. By use of the conductive contact 81, the external electrode 88a on the one face 87a and the land electrode 91 of the inspection circuit board 90 are electrically connected and at the same time, the inspection-use external electrode 93 on the one face 87a and the land electrode 91 of the inspection circuit board 90 are electrically connected. Accordingly, the external electrodes 88a and 88b on the two faces 87a and 87b of the semiconductor integrated circuit 87 are electrically connected to the land electrode 91 of the inspection circuit board 90, whereby an inspection can be performed for the semiconductor integrated circuit 87.

However, since the inspection-use external electrode 93 are provided in addition to the external electrodes 88a and 88b, the number of external electrodes 88a, 88b and 93 of the semiconductor integrated circuit 87 increases. Consequently, there arises a problem that the overall size of the semiconductor integrated circuit 87 becomes larger, thus limiting effects of high density achieved by stacking.

Consequently, an object of the present invention is to provide an inspection device and inspection method capable of inspecting electric characteristics of a semiconductor integrated circuit having electrodes on two opposite faces thereof without arranging any inspection-use external electrode in the semiconductor integrated circuit.

DISCLOSURE OF THE INVENTION

According to a first invention, there is provided an inspection device for inspecting electric characteristics of a semiconductor integrated circuit having one external electrode and the other external electrode on two faces thereof, the two faces being opposite to each other, wherein an inspection circuit board having a first electrode and a wiring board having a second electrode are arranged facing each other; a measuring device is connected to the inspection circuit board; a holding part holding the semiconductor integrated circuit is formed between the inspection circuit board and the wiring board;

a first conductive contact making contact with the first electrode of the inspection circuit board and the one external electrode of the semiconductor integrated circuit facing the inspection circuit board to electrically connect these electrodes is arranged in a fixed member; a second conductive contact making contact with the second electrode of the wiring board and the other external electrode of the semiconductor integrated circuit facing the wiring board to electrically connect these electrodes is arranged in a movable member; the wiring board is arranged in the movable member; the movable member is movable to a contacting position at which the second conductive contact makes contact with the other external electrode of the semiconductor integrated circuit and to a separating position at which the second conductive contact separates from the other external electrode; one third electrode is formed in the inspection circuit board; the other third electrode electrically connected to the second electrode through a wiring circuit is formed in the second electrode; and a third conductive contact is arranged in the movable member or the fixed member, the third conductive contact making contact with the one third electrode and the other third electrode to electrically connect these electrodes, when the movable member moves to the contacting position.

According to such configuration, the movable member is preliminarily made to move to the separating position, and the semiconductor integrated circuit is held by the holding part with the one face thereof facing the inspection circuit board, whereby the one external electrode of the semiconductor integrated circuit makes contact with the first conductive contact and thus, the first conductive contact connects the first electrode of the inspection circuit board and the one external electrode of the semiconductor integrated circuit.

Thereafter, the movable member is made to move from the separating position to the contacting position. As a result, the second conductive contact makes contact with the external electrode on the other face of the semiconductor integrated circuit and thereby connects the second electrode of the wiring board and the other external electrode of the semiconductor integrated circuit and at the same time, the third conductive contact makes contact with the one third electrode and the other third electrode to connect the two third electrodes.

Accordingly, the one external electrode of the semiconductor integrated circuit is electrically connected through the first conductive contact to the inspection circuit board and at the same time, the other external electrode of the semiconductor integrated circuit is electrically connected to the inspection circuit board through the second conductive contact, the wiring board and the third conductive contact to electrically connect the semiconductor integrated circuit and the measuring device, whereby electric characteristics can be inspected for the semiconductor integrated circuit.

Consequently, as with the prior art, there is no need to add to the one face of the semiconductor integrated circuit an inspection-use external electrode electrically connected to the external electrode on the other face. Accordingly, the increase in the number of external electrodes of the semiconductor integrated circuit can be prevented and the overall size of the semiconductor integrated circuit can be prevented from becoming larger, allowing achievement of effects of high density achieved by stacking.

A second invention is characterized in that characteristic impedance of the wiring board is matched to characteristic impedance of the inspection circuit board or the measuring device.

According to such configuration, the wiring board has impedance matching with the inspection circuit board or the measuring device, so satisfactory high-frequency transmission characteristics can be achieved.

A third invention is characterized in that the overall length of the third conductive contact is shorter than the sum of the overall length of the first conductive contact, the overall length of the second conductive contact and the overall height of the semiconductor integrated circuit.

According to such configuration, since it is generally difficult to achieve impedance matching between each of the first to third conductive contacts and the inspection circuit board or measuring device, the overall length of the third conductive contact difficult to be matched in impedance is shortened, whereby deterioration of high-frequency transmission characteristics introduced in the third conductive contact can be suppressed.

A fourth invention is characterized in that at least one of the first to third conductive contacts is anisotropic conductive rubber type.

A fifth invention is characterized in that the movable member is arranged in a conveying device conveying the semiconductor integrated circuit onto the holding part; an adsorbing member adsorbing the semiconductor integrated circuit between the first conductive contact and the second conductive contact is arranged in the movable member; the adsorbing member is movable between a protruding position protruding toward the inspection circuit board side and a retreating position retreating toward the movable member side; when the movable member moves to the separating position, the adsorbing member moves to the protruding position and the semiconductor integrated circuit adsorbed by the adsorbing member separates from the second conductive contact; and when the movable member moves to the contacting position, the adsorbing member moves to the retreating position and the other external electrode of the semiconductor integrated circuit makes contact with the second conductive contact.

According to such configuration, the adsorbing member adsorbs the semiconductor integrated circuit, and the conveying device conveys the semiconductor integrated circuit onto the holding part, along with the movable member. Then, the adsorbing by the adsorbing member is released and the movable member is made to move from the separating position to the contacting position. As a result, the one external electrode of the semiconductor integrated circuit makes contact with the first conductive contact, and the first conductive contact connects the first electrode of the inspection circuit board and the one external electrode of the semiconductor integrated circuit. At the same time, the adsorbing member moves from the protruding position to the retreating position, and the other external electrode of the semiconductor integrated circuit makes contact with the second conductive contact, and the second conductive contact connects the other external electrode of the semiconductor integrated circuit and the second conductive contact of the wiring board. Further, the third conductive contact makes contact with the one third electrode and the other third electrode to connect the two third electrodes.

Accordingly, the one external electrode of the semiconductor integrated circuit is electrically connected through the first conductive contact to the inspection circuit board and at the same time, the other external electrode of the semiconductor integrated circuit is electrically connected to the inspection circuit board through the second conductive contact, the wiring board and the third conductive contact to electrically connect the semiconductor integrated circuit and measuring device, whereby electric characteristics can be inspected for the semiconductor integrated circuit.

After completion of the inspection, the adsorbing member adsorbs the semiconductor integrated circuit, and the movable member is made to move from the contacting position to the separating position. As a result, the one external electrode of the semiconductor integrated circuit separates from the first conductive contact and at the same time, the adsorbing member moves from the retreating position to the protruding position to cause the semiconductor integrated circuit to separate from the second conductive contact and further to cause the third conductive contact to separate from the one third electrode or the other third electrode. In this state, by use of the conveying device, the semiconductor integrated circuit which has been inspected is conveyed from the holding part to another place, along with the movable member.

According to a sixth invention, there is provided an inspection method using an inspection device according to the first invention, wherein a semiconductor integrated circuit is held by a holding part; a movable member is made to move to a contacting position to electrically connect through a first conductive contact a first electrode of an inspection circuit board and one external electrode of the semiconductor integrated circuit and at the same time, to electrically connect through a second conductive contact a second electrode of a wiring board and the other external electrode of the semiconductor integrated circuit and further, to electrically connect through a third conductive contact one third electrode of the inspection circuit board and the other third electrode of the wiring board; an inspection signal is outputted from a measuring device to the one external electrode or the other external electrode of the semiconductor integrated circuit; and a response signal with respect to the inspection signal is received from the one or the other external electrode of the semiconductor integrated circuit by the measuring device to measure the response signal.

According to a seventh invention, there is provided an inspection device for inspecting electric characteristics of a semiconductor integrated circuit having one external electrode and the other external electrode on two faces thereof, the two faces being opposite to each other, wherein an inspection circuit board and an inspection-use semiconductor integrated circuit ("inspection-use semiconductor integrated circuit" as described herein indicates a semiconductor integrated circuit exclusively used for the above described semiconductor integrated circuit inspection) are arranged facing each other; the inspection circuit board has a first electrode; the inspection-use semiconductor integrated circuit has an identical structure to that of another semiconductor integrated circuit stacked on the semiconductor integrated circuit by a package-on-package technique and at the same time, includes an inspection-use external electrode on a face thereof facing the inspection circuit board; a measuring device is connected to the inspection circuit board; a holding part holding the semiconductor integrated circuit is formed between the inspection circuit board and the inspection-use semiconductor integrated circuit; a first conductive contact making contact with the first electrode of the inspection circuit board and the one external electrode of the semiconductor integrated circuit facing the inspection circuit board to electrically connect these electrodes is arranged in a fixed member; a second conductive contact making contact with the inspection-use external electrode of the inspection-use semiconductor integrated circuit and the other external electrode of the semiconductor integrated circuit facing the inspection-use semiconductor integrated circuit to electrically connect these electrodes is arranged in a movable member; the inspection-use semiconductor integrated circuit is arranged in the movable member; and the movable member is movable to a contacting position at which the second conductive contact makes contact with the other external electrode of the semiconductor integrated circuit and to a separating position at which the second conductive contact separates from the other external electrode.

According to such configuration, after movement of the movable member to the separating position, the semiconductor integrated circuit is held by the holding part with the one face thereof facing the inspection circuit board. As a result, the one external electrode of the semiconductor integrated circuit makes contact with the first conductive contact, and the first conductive contact connects the first electrode of the inspection circuit board and the one external electrode of the semiconductor integrated circuit.

Thereafter, when the movable member is made to move from the separating position to the contacting position, the second conductive contact makes contact with the external electrode on the other face of the semiconductor integrated circuit to connect the other external electrode of the semiconductor integrated circuit and the inspection-use external electrode of the inspection-use semiconductor integrated circuit.

Accordingly, the one external electrode of the semiconductor integrated circuit is electrically connected through the first conductive contact to the inspection circuit board and at the same time, the other external electrode of the semiconductor integrated circuit is electrically connected to the inspection-use semiconductor integrated circuit through the second conductive contact.

In this state, an inspection signal is outputted from the measuring device through the first conductive contact to the semiconductor integrated circuit, and a first response signal with respect to the inspection signal is received through the first conductive contact from the semiconductor integrated circuit by the measuring device. Also, a second response signal is outputted from the semiconductor integrated circuit through the second conductive contact to the inspection-use semiconductor integrated circuit, and a third response signal with respect to the second response signal, or a dummy signal is outputted from the inspection-use semiconductor integrated circuit through the second conductive contact to the semiconductor integrated circuit. Further, a fourth response signal with respect to the third response signal or the dummy signal is received through the first conductive contact from the semiconductor integrated circuit by the measuring device. When the first response signal and fourth response signal thus received are measured, electric characteristics can be inspected for the semiconductor integrated circuit.

Consequently, as with the prior art, there is no need to add to the one face of the semiconductor integrated circuit an inspection-use external electrode electrically connected to the external electrode on the other face. Accordingly, the increase in the number of external electrodes can be prevented and the overall size of the semiconductor integrated circuit can be prevented from becoming larger, allowing achievement of effects of high density achieved by stacking.

An eighth invention is characterized in that the measuring device outputs an inspection signal to the semiconductor integrated circuit and also receives a first response signal with respect to the inspection signal and further receives a third response signal or a fourth response signal with respect to a dummy signal; and the inspection-use semiconductor integrated circuit receives a second response signal outputted from the semiconductor integrated circuit and also outputs to the semiconductor integrated circuit the third response signal with respect to the second response signal, or the dummy signal.

A ninth invention is characterized in that a contact resistance between the inspection-use external electrode of the inspection-use semiconductor integrated circuit and the second conductive contact is made to be smaller than a contact resistance between the external electrode of the semiconductor integrated circuit and the first conductive contact.

According to such configuration, the electrical connection between the inspection-use external electrode of the inspection-use semiconductor integrated circuit and the second conductive contact can be stabilized for a long period and thus, electric characteristics can be more accurately inspected for the semiconductor integrated circuit.

According to a tenth invention, there is provided an inspection method using an inspection device according to the seventh invention, wherein a semiconductor integrated circuit is held by a holding part; a movable member is made to move to a contacting position to electrically connect through a first conductive contact a first electrode of an inspection circuit board and one external electrode of the semiconductor integrated circuit and at the same time, to electrically connect through a second conductive contact an inspection-use external electrode of an inspection-use semiconductor integrated circuit and the other external electrode of the semiconductor integrated circuit; an inspection signal is outputted from a measuring device through the first conductive contact to the semiconductor integrated circuit; a first response signal with respect to the inspection signal is received through the first conductive contact from the semiconductor integrated circuit by the measuring device; further, a second response signal is outputted from the semiconductor integrated circuit through the second conductive contact to the inspection-use semiconductor integrated circuit; a third response signal with respect to the second response signal or a dummy signal is outputted from the inspection-use semiconductor integrated circuit through the second conductive contact to the semiconductor integrated circuit; a fourth response signal with respect to the third response signal or the dummy signal is received through the first conductive contact from the semiconductor integrated circuit by the measuring device; and the first response signal and the fourth response signal thus received are measured.

According to an eleventh invention, there is provided an inspection device for inspecting electric characteristics for at least one of a first semiconductor integrated circuit having one external electrode and the other external electrode on two faces thereof, the two faces being opposite to each other, and a second semiconductor integrated circuit having an external electrode only on one face thereof, stacked on the first semiconductor integrated circuit by a package-on-package technique, characterized in that a fixed member is arranged between an inspection circuit board and a movable member; a first electrode is arranged on the inspection circuit board; a measuring device is connected to the inspection circuit board; a first conductive contact is arranged in the fixed member; the movable member is movable on a movement path on which the movable member approaches or separates from the fixed member, and constituted of a first movable body and a second movable body movable separately from each other; the second movable body is arranged facing the fixed member; the first movable body is arranged between the second movable body and the fixed member; a second conductive contact is arranged in the first movable body; a first holding part holding the first semiconductor integrated circuit is formed between the fixed member and the first movable body; a second holding part holding the second semiconductor integrated circuit is formed between the first movable body and the second movable body; the first conductive contact makes contact with the first electrode and the one external electrode of the first semiconductor integrated circuit held by the first holding part to electrically connect these electrodes; the second conductive contact makes contact with the other external electrode of the first semiconductor integrated circuit held by the first holding part and the external electrode of the second semiconductor integrated circuit held by the second holding part to electrically connect these electrodes; the first movable body is movable to a first contacting position at which the second conductive contact makes contact with the other external electrode of the first semiconductor integrated circuit and to a first separating position at which the second conductive contact separates from the other external electrode of the first semiconductor integrated circuit; and the second movable body is movable to a second contacting position at which, the second movable body makes contact with the second semiconductor integrated circuit held by the second holding part to press the external electrode of the second semiconductor integrated circuit against the second conductive contact, and to a second separating position at which the second movable body separates from the second semiconductor integrated circuit.

According to such configuration, when electric characteristics are inspected for the first semiconductor integrated circuit, the second semiconductor integrated circuit is preliminarily held by the second holding part, and the second movable body is preliminarily made to move to the second contacting position. Accordingly, the second movable body makes contact with the second semiconductor integrated circuit to press the external electrode of the second semiconductor integrated circuit against the second conductive contact.

Thereafter, the first movable body is made to move to the first separating position, and the first semiconductor integrated circuit to be inspected is held by the first holding part. Accordingly, the first conductive contact makes contact with the first electrode and the one external electrode of the first semiconductor integrated circuit.

Then, the first movable body is made to move to the first contacting position, along with the second movable body. Accordingly, the second conductive contact makes contact with the other external electrode of the first semiconductor integrated circuit and thus, the first conductive contact connects the first electrode of the inspection circuit board and the one external electrode of the first semiconductor integrated circuit. At the same time, the second conductive contact connects the other external electrode of the first semiconductor integrated circuit and the external electrode of the second semiconductor integrated circuit.

Accordingly, the one external electrode of the first semiconductor integrated circuit is electrically connected through the first conductive contact to the inspection circuit board and at the same time, the other external electrode of the first semiconductor integrated circuit is electrically connected through the second conductive contact to the second semiconductor integrated circuit, whereby electric characteristics can be inspected for the first semiconductor integrated circuit.

Thereafter, the first movable body is made to move from the first contacting position to the first separating position, along with the second movable body, and the first semiconductor integrated circuit which has been inspected is removed from the first holding part and then, another first semiconductor integrated circuit to be inspected is held by the first holding part to inspect the first semiconductor integrated circuit by a procedure similar to the one described above.

Also, when electric characteristics are inspected for the second semiconductor integrated circuit, the first semiconductor integrated circuit is preliminarily held by the first holding part, and the first movable body is preliminarily made to move to the first contacting position. Accordingly, the second conductive contact makes contact with the other external electrode of the first semiconductor integrated circuit and at the same time, the first conductive contact connects the first electrode of the inspection circuit board and the one external electrode of the first semiconductor integrated circuit.

Thereafter, the second movable body is made to move to the second separating position, and the second semiconductor integrated circuit to be inspected is held by the second holding part. Accordingly, the second conductive contact makes contact with the external electrode of the second semiconductor integrated circuit. Then, the second movable body is made to move to the second contacting position. Accordingly, the second movable body makes contact with the second semiconductor integrated circuit to press the external electrode of the second semiconductor integrated circuit against the second conductive contact, so that the second conductive contact connects the external electrode of the second semiconductor integrated circuit and the other external electrode of the first semiconductor integrated circuit.

Accordingly, the one external electrode of the first semiconductor integrated circuit is electrically connected through the first conductive contact to the inspection circuit board and at the same time, the external electrode of the second semiconductor integrated circuit is electrically connected through the second conductive contact to the other external electrode of the first semiconductor integrated circuit, whereby electric characteristics can be inspected for the second semiconductor integrated circuit.

Thereafter, the second movable body is made to move from the second contacting position to the second separating position, and the second semiconductor integrated circuit which has been inspected is removed from the second holding part, and another second semiconductor integrated circuit to be inspected is held by the second holding part to inspect the second semiconductor integrated circuit by a procedure similar to the one described above.

A twelfth invention is characterized in that when electric characteristics are inspected for the first semiconductor integrated circuit, a contact resistance between the external electrode of the second semiconductor integrated circuit and the second conductive contact is made to be smaller than a contact resistance between the external electrode of the first semiconductor integrated circuit and the first conductive contact; and when electric characteristics are inspected for the second semiconductor integrated circuit, a contact resistance between the external electrode of the first semiconductor integrated circuit and the first conductive contact is made to be smaller than a contact resistance between the external electrode of the second semiconductor integrated circuit and the second conductive contact.

Accordingly, when electric characteristics are not inspected for the second semiconductor integrated circuit but inspected only for the first semiconductor integrated circuit, electrical connection between the external electrode of the second semiconductor integrated circuit and the second conductive contact can be stabilized for a long period and thus, electric characteristics can be more accurately inspected.

Also, when electric characteristics are not inspected for the first semiconductor integrated circuit but inspected only for the second semiconductor integrated circuit, electrical connection between the external electrode of the first semiconductor integrated circuit and the first conductive contact can be stabilized for a long period and thus, electric characteristics can be more accurately inspected.

DESCRIPTION OF THE EMBODIMENTS

Figure 1A:
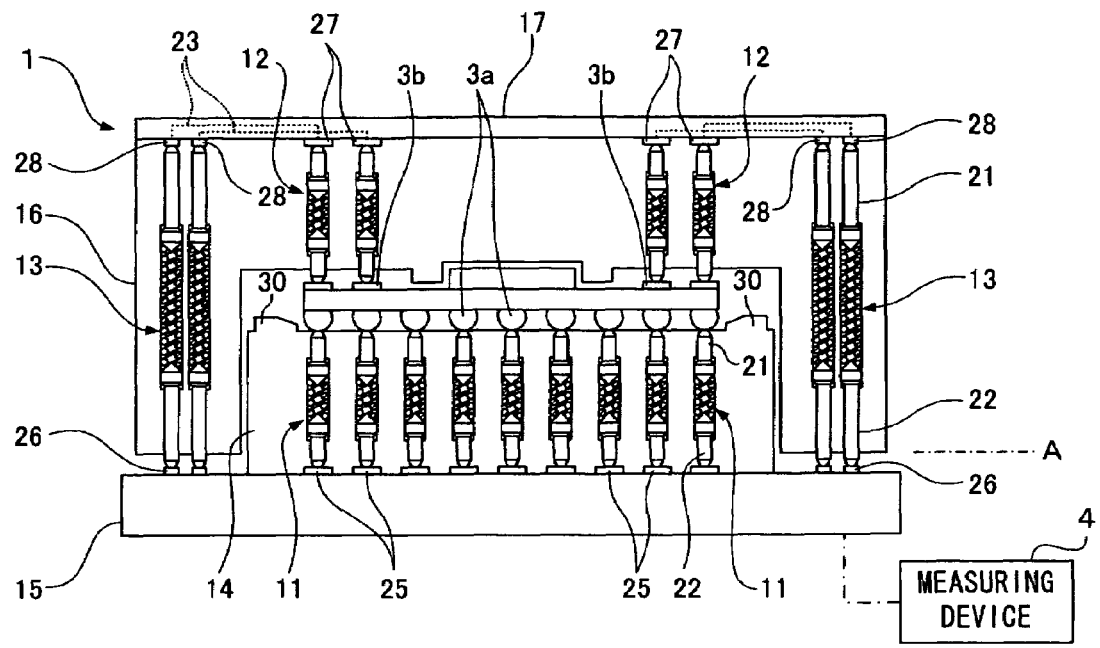
FIG. 1A is a view of an inspection device according to Embodiment 1 of the present invention, illustrating a state in which a movable body is made to move down to a lower limit position.

The present invention will be described more in detail with reference to the accompanying drawings.

Embodiment 1

First, Embodiment 1 will be described with reference to FIGS. 1A to 6.

As illustrated in FIGS. 1A to 4, an inspection device 1 serves to inspect electric characteristics of a semiconductor integrated circuit 2 by use of a measuring device 4. As illustrated in FIG. 5, on two opposite faces 2a and 2b of the semiconductor integrated circuit 2, there are formed a plurality of external electrodes 3a and 3b, respectively.

The inspection device 1 includes first to third conductive contacts 11 to 13 of pogopin type (spring-incorporating contact pin type), a fixed member 14, an inspection circuit board 15 connected to the measuring device 4, a movable member 16 and a wiring board 17.

Above the inspection circuit board 15, there is arranged the wiring board 17 facing the inspection circuit board 15. The inspection circuit board 15 is arranged detachably in a lower part of the fixed member 14 by use of a screw (not illustrated) or the like. On the upper face of the inspection circuit board 15, there are formed a plurality of first land electrodes 25 (an example of first electrode) and a plurality of fixed-side third land electrodes 26 (an example of one third electrode).

Conductive contacts 11 to 13 are each constituted, similarly to prior art, of a cylinder body 19, a compression spring 20, one plunger 21 and the other plunger 22. The first and second conductive contacts 11 and 12 are equal in length, and the third conductive contact 13 is longer than the first and second conductive contacts 11 and 12.

The first conductive contact 11 serves to make contact with the first land electrode 25 of the inspection circuit board 15 and the one external electrode 3a of the semiconductor integrated circuit 2 to electrically connect these electrodes 25 and 3a. A plurality of the first conductive contacts 11 are arranged in the fixed member 14 with the one plunger 21 facing upward and the other plunger 22 facing downward.

Figure 1B:
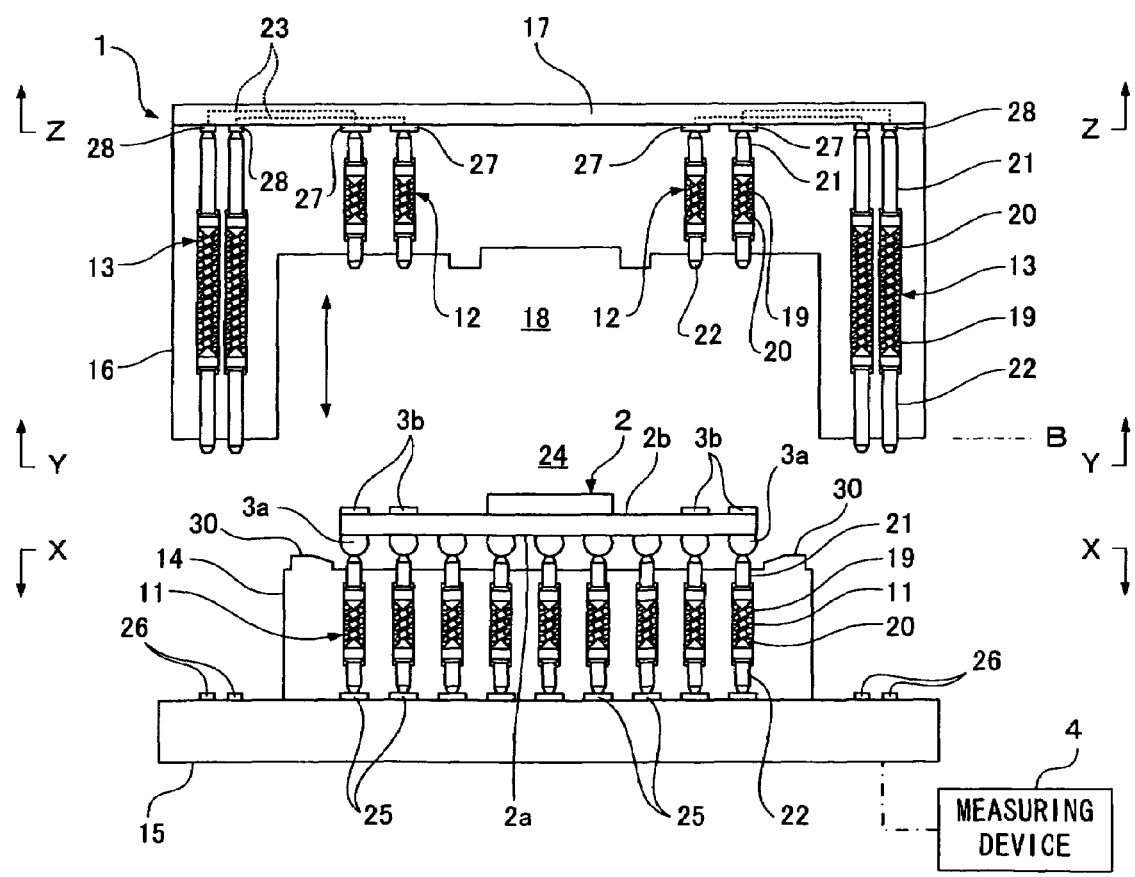
FIG. 1B is a view of an inspection device according to Embodiment 1 of the present invention, illustrating a state in which the movable body is made to move up to a higher limit position.
Figure 2:
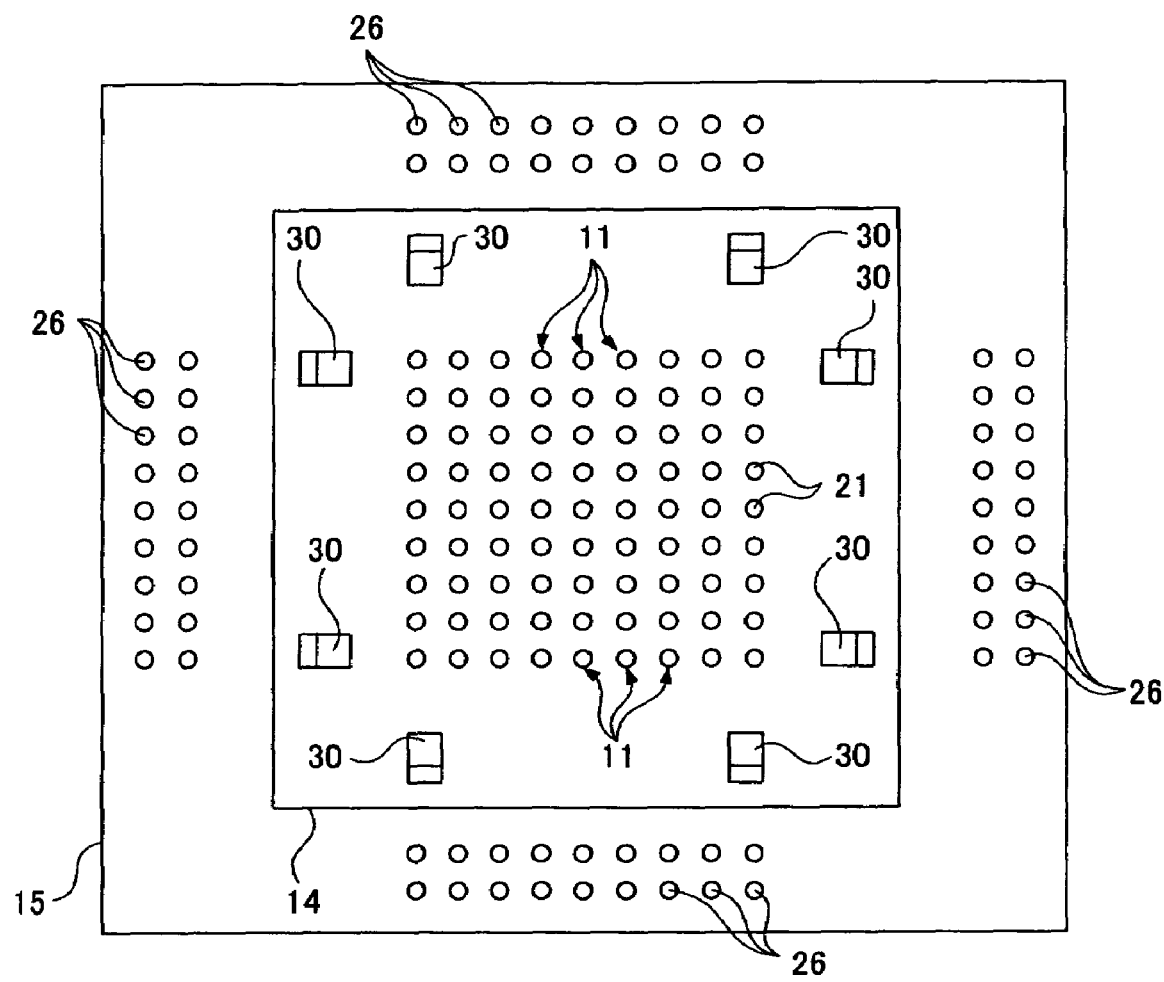
FIG. 2 is a view observed along the line X-X of FIG. 1B.

As illustrated in FIGS. 1A, 1B and 2, the fixed member 14 is constituted of a frame being square in a plan view. In an upper part of the fixed member 14 (i.e., between the inspection circuit board 15 and the wiring board 17), there are arranged a holding part 24 holding the semiconductor integrated circuit 2 and a protruding part 30 for locating the semiconductor integrated circuit 2 in the holding part 24. A plurality of the protruding parts 30 are arranged so as to surround the periphery of the holding part 24. In the holding part 24, the semiconductor integrated circuit 2 is supported by the first conductive contact 11.

Figure 3:
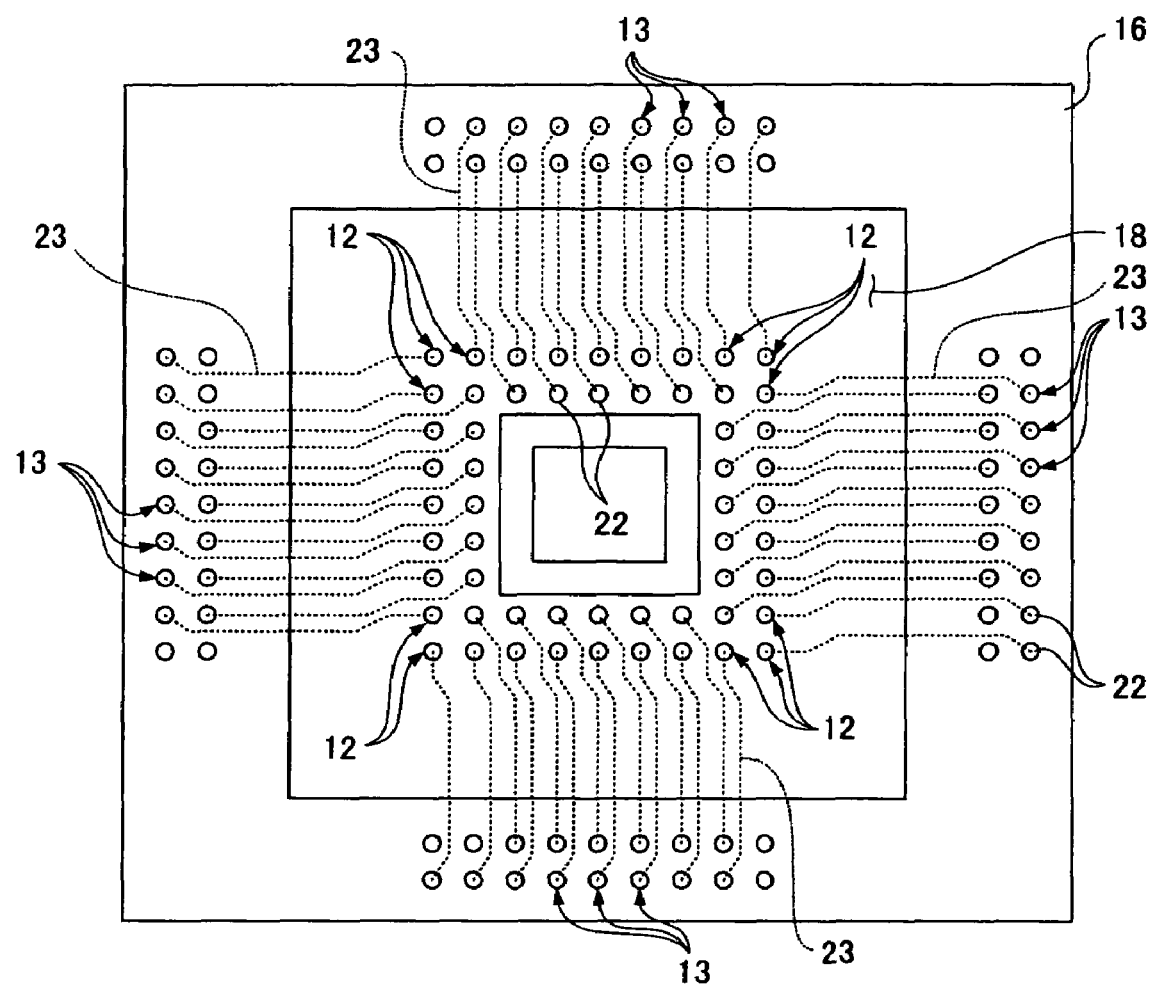
FIG. 3 is a view observed along the line Y-Y of FIG. 1B.

As illustrated in FIGS. 1A, 1B and 3, the movable member 16 is constituted of a frame being square in a plan view and configured so as to move in a vertical direction relative to the fixed member 14. The movable member 16 is moved up and down by a drive device (not illustrated) constituted of a cylinder, a motor or the like.

In the movable member 16, there is formed a concave receiving part 18 having an opening in the lower part thereof. As illustrated in FIG. 1A, at a lower limit position A (an example of contacting position), the fixed member 14 is received into the receiving part 18 of the movable member 16; as illustrated in FIG. 1B, at an upper limit position B (an example of separating position), the receiving part 18 separates upward of the fixed member 14 and the fixed member 14 is exposed downward of the movable member 16.

Figure 4:
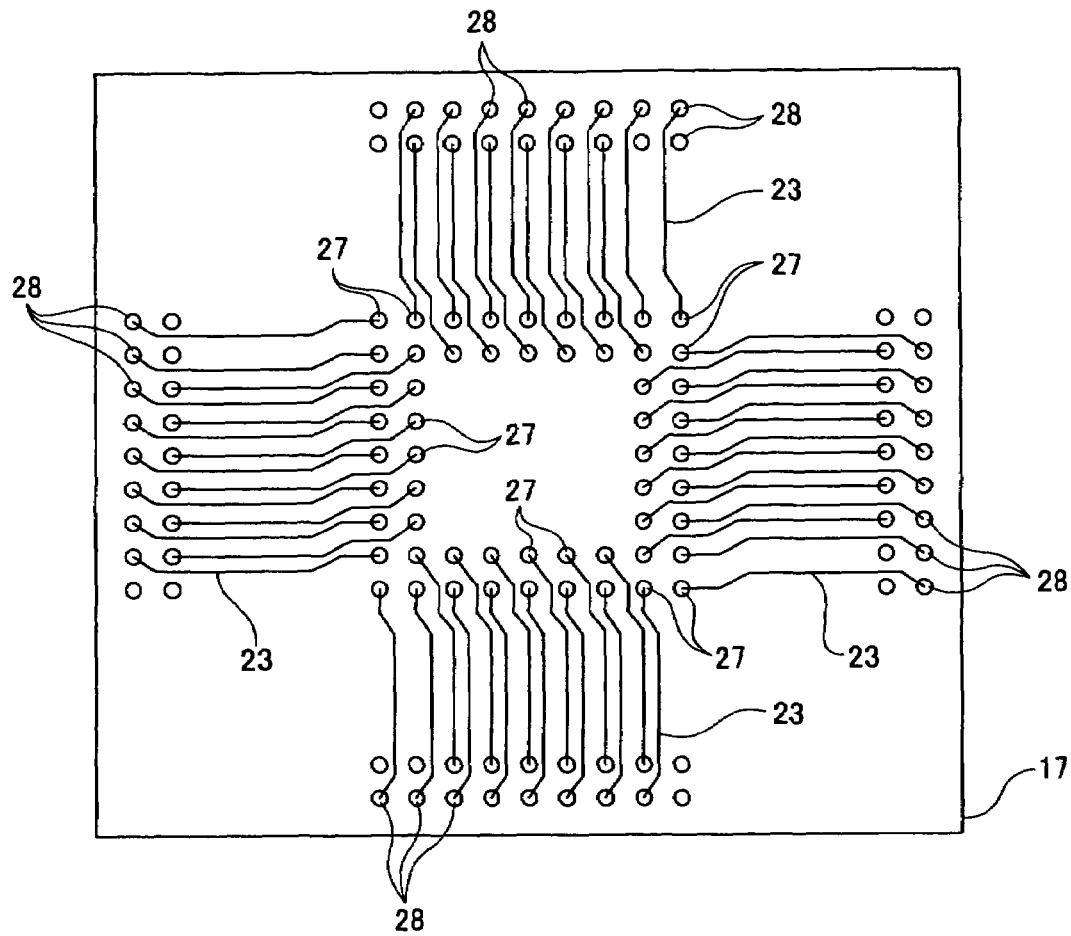
FIG. 4 is a view observed along the line Z-Z of FIG. 1B.
Figure 5:
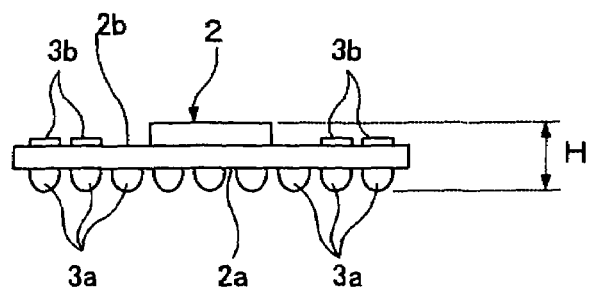
FIG. 5 is a view of a semiconductor integrated circuit inspected by the inspection device.

As illustrated in FIGS. 1A, 1B and 4, the wiring board 17 is arranged detachably in an upper part of the movable member 16 by use of a screw (not illustrated) or the like. On the lower face of the wiring board 17, there are formed a plurality of second land electrodes 27 (an example of second electrode) and a plurality of movable-side fourth land electrodes 28 (an example of the other third electrode). The second land electrode 27 and the movable-side fourth land electrode 28 are each electrically connected through a wiring circuit 23 formed in the wiring board 17.

A plurality of second and third conductive contacts 12 and 13 are arranged in the movable member 16 with the one plunger 22 facing upward and the other plunger 22 facing downward. The second conductive contact 12 serves to make contact with the second land electrode 27 of the wiring board 17 and the other external electrode 3b of the semiconductor integrated circuit 2 to electrically connect these electrodes 27 and 3b. The third conductive contact 13 serves to make contact with the fixed-side third land electrode 26 of the inspection circuit board 15 and the movable-side fourth land electrodes 28 of the wiring board 17 to electrically connect these electrodes 26 and 28.

The operation in the above configuration will now be described.

As illustrated in FIG. 1B, in a state in which the movable member 16 is made to move up to the upper limit position B, the tip end of the other plunger 22 of each of the first conductive contacts 11 contacts the first land electrode 25, and also the tip end of the one plunger 21 of each of the second conductive contacts 12 contacts the second land electrode 27, and also the tip end of the one plunger 21 of each of the third conductive contacts 13 contacts the movable-side fourth land electrode 28.

In this state, when the semiconductor integrated circuit 2 is placed in the holding part 24, the external electrode 3a on the one face 2a of the semiconductor integrated circuit 2 contacts the tip end of the one plunger 21 of each of the first conductive contacts 11.

Thereafter, as illustrated in FIG. 1A, when the movable member 16 is made to move down from the upper limit position B to the lower limit position A, the fixed member 14 is received into the receiving part 18 of the movable member 16, and the tip end of the other plunger 22 of each of the second conductive contacts 12 contacts the external electrode 3b on the other face 2b of the semiconductor integrated circuit 2 and at the same time, the tip end of the other plunger 22 of each of the third conductive contact 13 contacts the fixed-side third land electrode 26.

Accordingly, the one external electrode 3a of the semiconductor integrated circuit 2 is electrically connected through the first conductive contact 11 to the inspection circuit board 15 and at the same time, the other external electrode 3b of the semiconductor integrated circuit 2 is electrically connected through the second conductive contact 12, the wiring board 17 and the third conductive contact 13 to the inspection circuit board 15. As a result, the semiconductor integrated circuit 2 and the measuring device 4 are electrically connected, whereby electric characteristics can be inspected for the semiconductor integrated circuit 2.

Consequently, as with the prior art, there is no need to add to the one face 2a of the semiconductor integrated circuit 2 an inspection-use external electrode electrically connected to the other external electrode 3b. Accordingly, the increase in the number of external electrodes can be prevented and the overall size of the semiconductor integrated circuit 2 can be prevented from becoming larger, allowing achievement of effects of high density achieved by stacking.

Also, when the movable member 16 is made to move down to the lower limit position A as described above, the compression spring 20 in each of the conductive contacts 11 to 13 is compressed and due to a repulsive force of these compression springs 20, there is generated a contact load of the plungers 21 and 22 of each of the conductive contacts 11 to 13, the contact load being exerted on the respective electrodes 3a, 3b and 25 to 28, and thus the plungers 21 and 22 of each of the conductive contacts 11 to 13 are pressed against the respective electrodes 3a, 3b and 25 to 28, allowing achievement of stable electrical conduction.

After completion of the inspection, as illustrated in FIG. 1B, when the movable member 16 is made to move up from the lower limit position A to the upper limit position B, the tip end of the other plunger 22 of each of the second conductive contact 12 separates upward from the other external electrode 3b of the semiconductor integrated circuit 2 and at the same time, the tip end of the other plunger 22 of each of the third conductive contact 13 separates upward from the fixed-side third land electrode 26.

A method for inspecting a semiconductor integrated circuit 2 by use of the above measuring device 1 will now be described.

As described above, as illustrated in FIG. 1A, when the movable member 16 is made to move down to the lower limit position A, the first land electrode 25 of the inspection circuit board 15 and the one external electrode 3a of the semiconductor integrated circuit 2 are electrically connected through the first conductive contact 11 and at the same time, the second land electrode 27 of the wiring board 17 and the other external electrode 3b of the semiconductor integrated circuit 2 are electrically connected through the second conductive contact 12, and also the fixed-side third land electrode 26 of the inspection circuit board 15 and the movable-side third land electrode 28 of the wiring board 17 are electrically connected through the third conductive contact 13.

Figure 6:
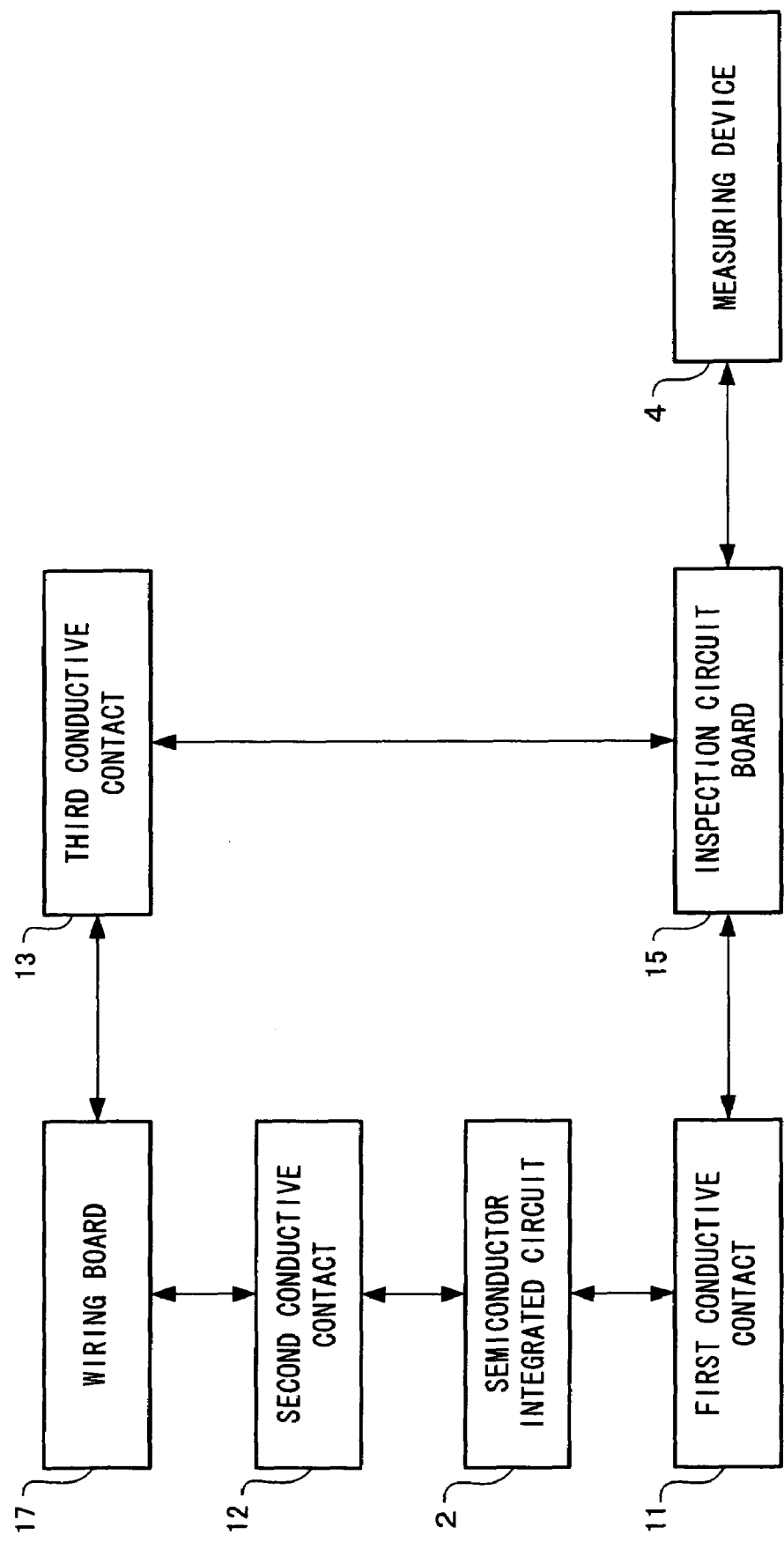
FIG. 6 is a block diagram illustrating a signal transmission path of the inspection device.

Then, as illustrated in FIG. 6, with the external electrodes 3a and 3b of the semiconductor integrated circuit 2 electrically connected to the measuring device 4, an inspection signal is supplied from the measuring device 4 to the external electrodes 3a and 3b for a given time period and thereafter, a response signal with respect to the inspection signal is received from the external electrodes 3a and 3b by the measuring device 4 for a given time period, and the received response signal is measured by the measuring device 4 to determine a measuring result, whereby electric characteristics of the semiconductor integrated circuit 2 are inspected.

In this case, an inspection signal with respect to one of or a plurality of the one external electrodes 3a is supplied from the measuring device 4 through the inspection circuit board 15 and the first conductive contact 11 to any of the one external electrodes 3a. Further, a response signal outputted from one of or a plurality of the one external electrodes 3a is received through the first conductive contact 11 and the inspection circuit board 15 by the measuring device 4 and the signal is measured.

Also, an inspection signal with respect to one of or a plurality of the other external electrodes 3b is supplied from the measuring device 4 through the inspection circuit board 15, the third conductive contact 13, the wiring board 17 and the second conductive contact 12 to any of the other external electrodes 3b. Further, a response signal outputted from one of or a plurality of the other external electrodes 3b is received through the second conductive contact 12, the wiring board 17, the third conductive contact 13 and the inspection circuit board 15 by the measuring device 4, and the signal is measured.

Embodiment 2

Embodiment 2 will now be described with reference to FIGS. 7A, 7B, 8A and 8B.

Figure 7A:
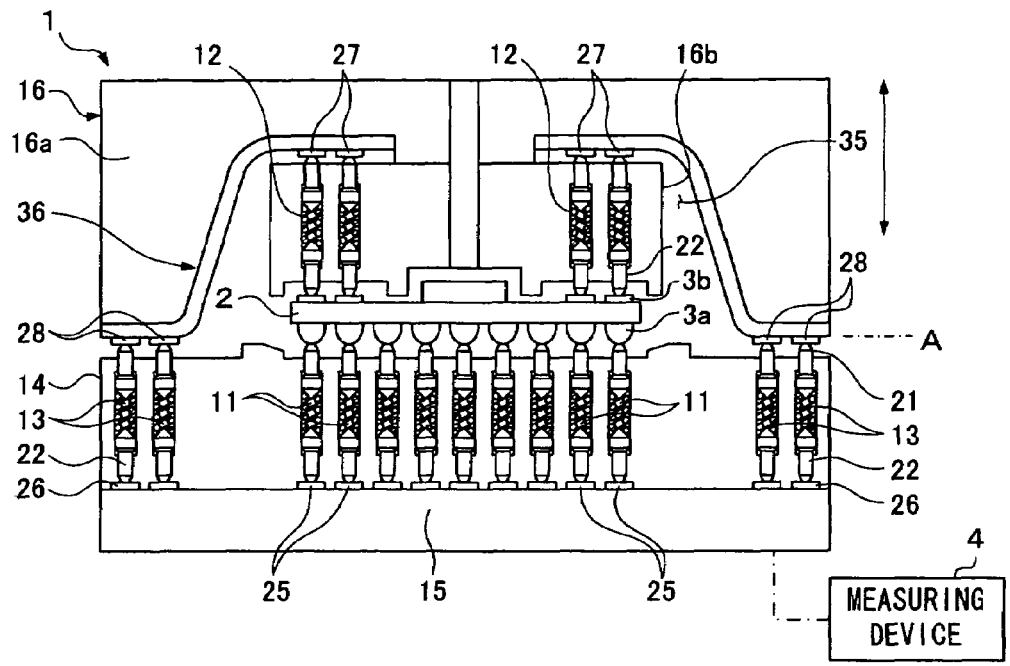
FIG. 7A is a view of an inspection device according to Embodiment 2 of the present invention, illustrating a state in which a movable body is made to move down to a lower limit position.
Figure 7B:
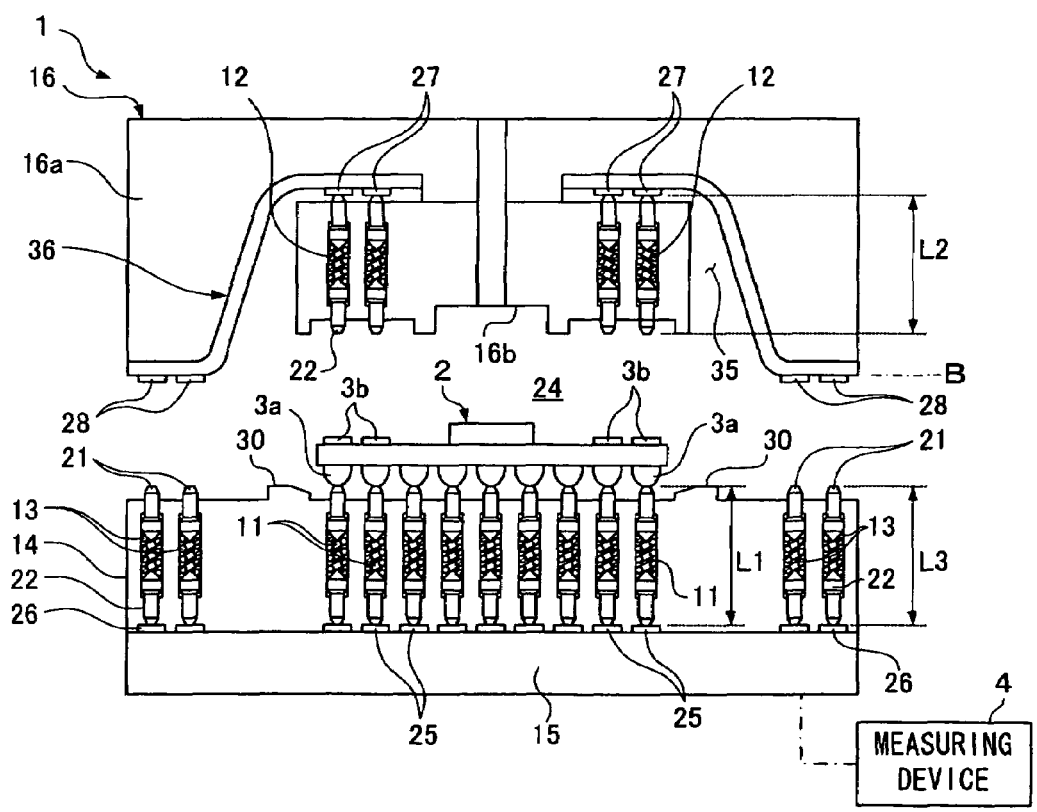
FIG. 7B is a view of an inspection device according to Embodiment 2 of the present invention, illustrating a state in which the movable body is made to move up to a higher limit position.

As illustrated in FIGS. 7A and 7B, a movable member 16 is divided into an external member 16a and an internal member 16b. The external member 16a and internal member 16b are each square in a plan view. In the center of the external member 16a, there is formed a concave void part 35 having an opening in the lower part thereof. The internal member 16b is arranged in the void part 35 and thereby mounted in the external member 16a.

Figure 8A:
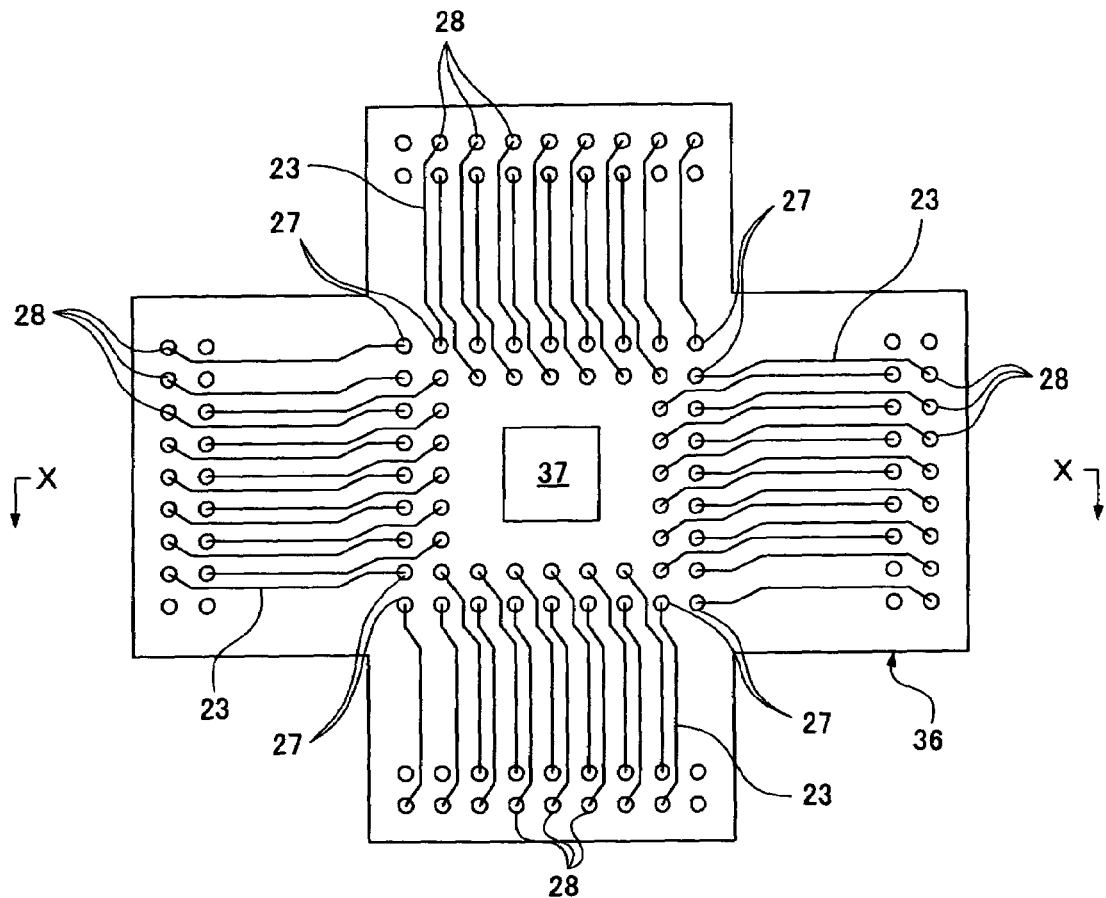
FIG. 8A is a view of a flexible wiring board of the inspection device as seen from a fixed member side (from there beneath)
Figure 8B:
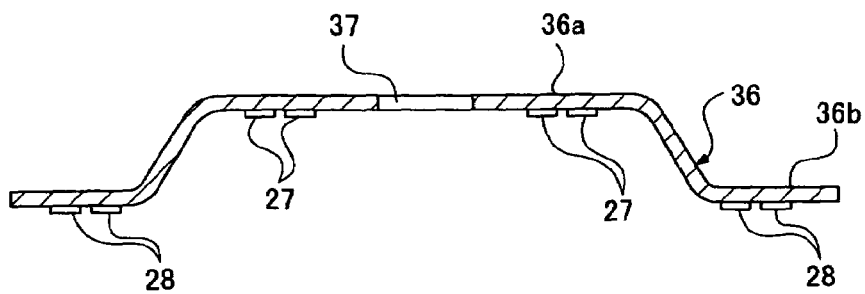
FIG. 8B is a view of a flexible wiring board of the inspection device, illustrating a view observed along the line X-X of FIG. 8A.

Also, as the wiring board, there is used a flexible wiring board 36 being flexible and bendable. As illustrated in FIGS. 8A and 8B, in the center of the flexible wiring board 36, there is formed a hole 37. The flexible wiring board 36 has a bended configuration; the periphery of the hole 37 (the center of the board 36) constitutes an upper part 36a, and the outer circumferential part constitutes a lower part 36b positioned lower than the upper part 36a.

The upper part 36a of the flexible wiring board 36 is inserted into a gap between the external member 16a and the internal member 16b and mounted therein. The lower part 36b of the flexible wiring board 36 is mounted on an outer circumferential lower face of the external member 16a.

A plurality of the second land electrodes 27 are formed on the lower face of the upper part 36a of the flexible wiring board 36. A plurality of movable-side third land electrodes 28 are formed on the lower face of the lower part 36b of the flexible wiring board 36. First and third conductive contacts 11 and 13 are arranged in a fixed member 14. The tip end of the other plunger 22 of the third conductive contact 13 contacts a fixed-side third land electrode 26. Also, the second conductive contact 12 and electrode 27 is arranged in the internal member 16b of the movable member 16.

The inspection circuit board 15 and the measuring device 4 each have a predetermined characteristic impedance. The wiring width and interval of the flexible wiring board 36 is properly designed, whereby the characteristic impedance of the flexible wiring board 36 is matched to that of the inspection circuit board 15 or the measuring device 4. For example, when the characteristic impedance of the inspection circuit board 15 and that of the measuring device 4 are each 50Ω, the characteristic impedance of the flexible wiring board 36 is matched to 50Ω.

The operation in the above configuration will be described below.

As illustrated in FIG. 7B, with the movable member 16 moved up to the upper limit position B and the one face 2a thereof facing the fixed member 14, a semiconductor integrated circuit 2 is placed in a holding part 24 of the fixed member 14. Accordingly, one external electrodes 3a of the semiconductor integrated circuit 2 each contacts the tip end of the one plunger 21 of the first conductive contact 11.

Thereafter, as illustrated in FIG. 7A, when the movable member 16 is made to move down to the lower limit position A, the tip end of the other plunger 22 of each of the second conductive contacts 12 contacts the external electrode 3b on the other face 2b of the semiconductor integrated circuit 2 and at the same time, the tip end of the one plunger 21 of each of the third conductive contacts 13 contacts the movable-side fourth land electrode 28 of the flexible wiring board 36.

Accordingly, the one external electrode 3a of the semiconductor integrated circuit 2 is electrically connected through the first conductive contact 11 to the inspection circuit board 15 and at the same time, the other external electrode 3b of the semiconductor integrated circuit 2 is electrically connected through the second conductive contact 12, the flexible wiring board 36 and the third conductive contact 13 to the inspection circuit board 15. As a result, the semiconductor integrated circuit 2 and the measuring device 4 are electrically connected, whereby electric characteristics can be inspected for the semiconductor integrated circuit 2.

In this case, the flexible wiring board 36 has impedance matching with each of the inspection circuit board 15 and the measuring device 4, so satisfactory high-frequency transmission characteristics can be achieved.

Also, according to this Embodiment 2, the bendable flexible wiring board 36 is used, so that the movable-side third land electrode 28 can be positioned lower than the second land electrode 27 (i.e., in a direction of approaching the fixed member 14). Accordingly, when the overall height of the semiconductor integrated circuit 2 is H (refer to FIG. 5), the overall length of the first conductive contact 11 is L1, the overall length of the second conductive contact 12 is L2, and the overall length of the third conductive contact 13 is L3, the overall length L3 can be shorter than the sum of the overall height H and the overall lengths L1 and L2 (i.e., L3<H+L1+L2).

Generally, it is difficult to achieve impedance matching between each of the first to third conductive contacts 11 to 13 and the inspection circuit board 15 or the measuring device 4. Thus, when the above dimensional relationship (i.e., L3<H+L1+L2) is provided, the overall length L3 of the third conductive contact 13 for which impedance matching is difficult to achieve is shorter than that according to Embodiment 1 described above. Consequently, deterioration in high-frequency transmission characteristics introduced in the third conductive contact 13 can be suppressed.

Further, the flexible wiring board 36 is used, whereby the overall lengths L1 to L3 of the first to third conductive contacts 11 to 13 can all be standardized to the same value (for example, 3 mm). Accordingly, the first to third conductive contacts 11 to 13 can be standardized to one type, allowing reduction in the number of types of components.

Embodiment 3

Embodiment 3 will now be described with reference to FIGS. 9A to 11.

Figure 9A:
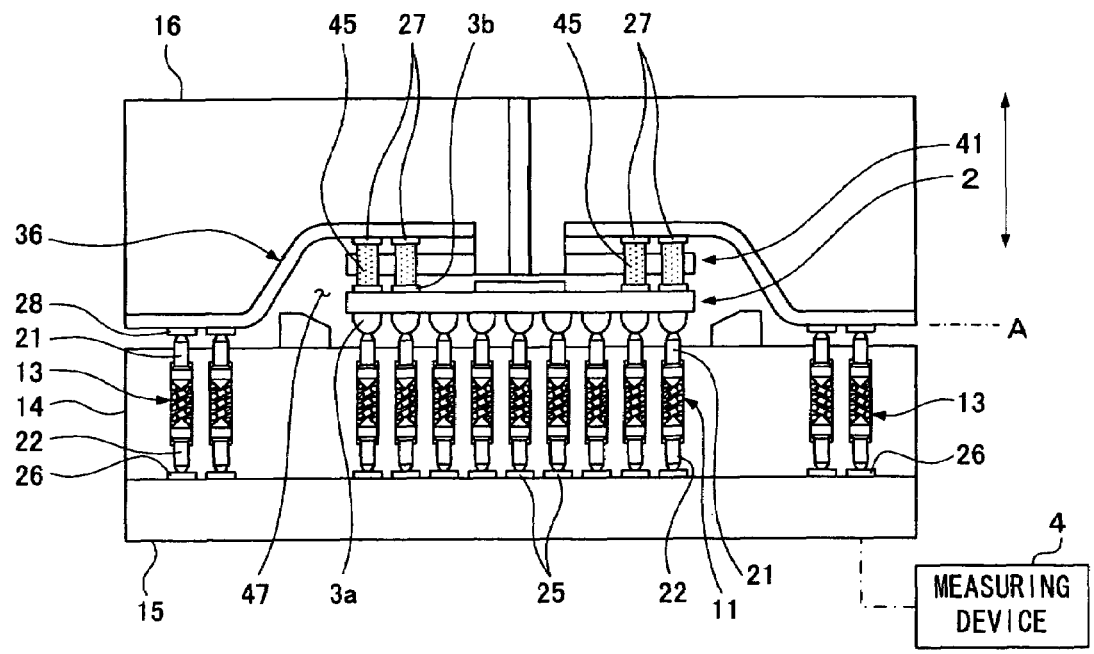
FIG. 9A is a view of an inspection device according to Embodiment 3 of the present invention, illustrating a state in which a movable body is made to move down to a lower limit position.
Figure 9B:
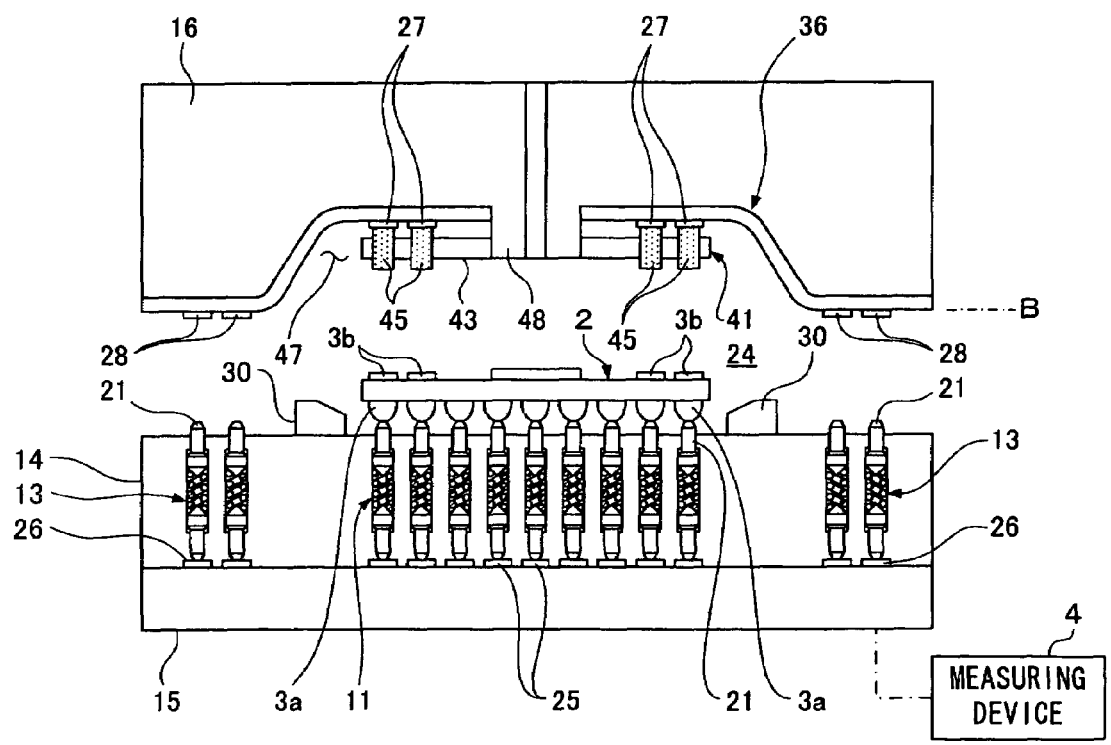
FIG. 9B is a view of an inspection device according to Embodiment 3 of the present invention, illustrating a state in which the movable body is made to move up to a higher limit position.

According to Embodiment 3, as illustrated in FIGS. 9A and 9B, instead of the second conductive contact 12 of pogopin type (spring-incorporating contact pin type) according to Embodiment 2 described above, a second conductive contact 41 of anisotropic conductive rubber type is used.

Figure 10:
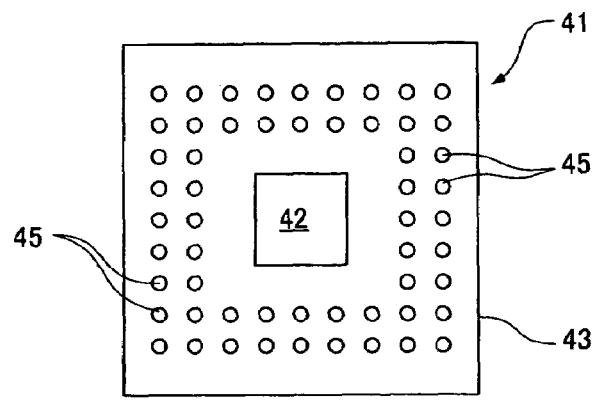
FIG. 10 is a plan view of a second conductive contact of the inspection device.
Figure 11:
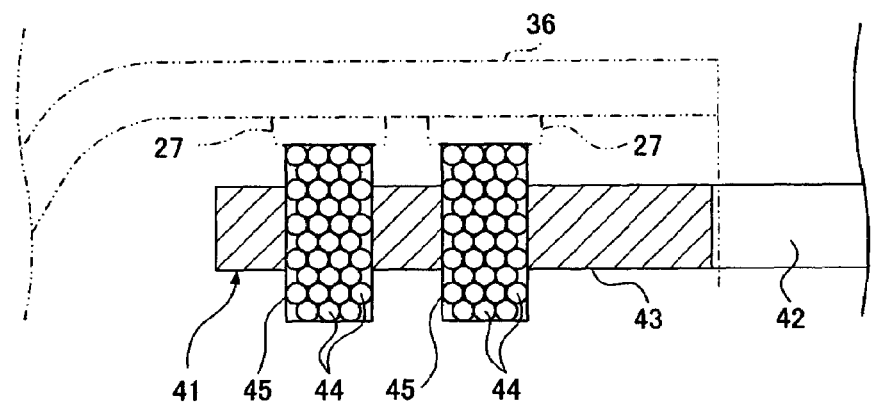
FIG. 11 is a partial enlarged cross-sectional view of the second conductive contact of the inspection device.

The second conductive contact 41 is constituted of, as illustrated in FIGS. 10 and 11, a silicon rubber part 43 in the shape of square board having a hole 42 in the center thereof, and a plurality of metal particle including parts 45. These metal particle including parts 45 have gold particles 44 (or metal particles composed of nickel coated with gold) having excellent conductivity and contained in silicon rubber. Due to the gold particles 44 of the metal particle including part 45, electrical conductivity is achieved only in one direction.

Also, in a movable member 16, there is formed a concave void part 47 having an opening in the lower part thereof. In the ceiling of the void part 47, there is formed a protruding part 48 protruding downward (i.e., toward a fixed member 14). The protruding part 48 is inserted into a hole 37 of the flexible wiring board 36 and a hole 42 of the silicon rubber part 43, and the flexible wiring board 36 is mounted on the lower face (a face opposite to the fixed member 14) of the movable member 16, and the second conductive contact 41 is mounted on the lower face of a flexible wiring board 36. The tip end of each of the metal particle including parts 45 of the second conductive contact 41 contacts a second land electrode 27 of the flexible wiring board 36.

The operation in the above configuration will be described below.

As illustrated in FIG. 9B, with the movable member 16 moved up to an upper limit position B and the one face 2a thereof facing (downward) the fixed member 14, a semiconductor integrated circuit 2 is placed in a holding part 24 of the fixed member 14. Accordingly, the one external electrodes 3a of the semiconductor integrated circuit 2 each contacts the tip end of the one plunger 21 of the first conductive contact 11.

Thereafter, as illustrated in FIG. 9A, when the movable member 16 is made to move down to the lower limit position A, the tip end of each of the metal particle including part 45 of the second conductive contact 41 makes contact with the other external electrode 3b of the semiconductor integrated circuit 2 and at the same time, the tip end of the one plunger 21 of each of the third conductive contacts 13 contacts the movable-side fourth land electrode 28 of the flexible wiring board 36.

Accordingly, the one external electrode 3a of the semiconductor integrated circuit 2 is electrically connected through the first conductive contact 11 to the inspection circuit board 15 and at the same time, the other external electrode 3b of the semiconductor integrated circuit 2 is electrically connected through the second conductive contact 41, the flexible wiring board 36 and the third conductive contact 13 to the inspection circuit board 15. As a result, the semiconductor integrated circuit 2 and the measuring device 4 are electrically connected, whereby electric characteristics can be inspected for the semiconductor integrated circuit 2.

Also, when the movable member 16 is made to move down to the lower limit position A as described above, the compression spring 20 in the first and third conductive contacts 11 and 13 is compressed and at the same time, the metal particle including part 45 of the second conductive contact 41 is compressed. Due to a repulsive force of the compression spring 20, there is generated a contact load of the plungers 21 and 22 of the first and third conductive contacts 11 and 13, the contact load being exerted on the respective electrodes 3a, 25, 26 and 28. At the same time, due to elasticity of silicon rubber of the metal particle including part 45, there is generated a contact load of the particle including part 45 of the second conductive contact 41, the contact load being exerted on the respective electrodes 3b and 27. Accordingly, the plungers 21 and 22 of the first and third conductive contacts 11 and 13 and the metal particle including part 45 of the second conductive contact 41 are pressed against the respective electrodes 3a, 3b and 25 to 28, allowing achievement of stable electrical conduction.

Embodiment 4

Figure 12:
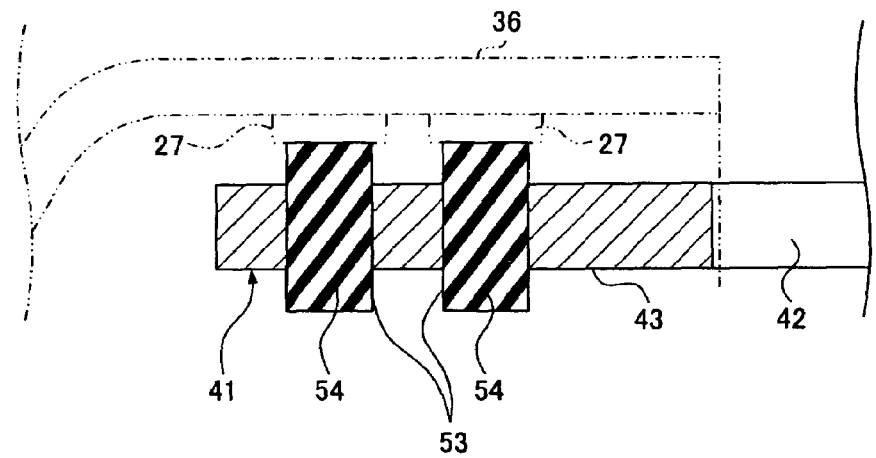
FIG. 12 is a partial enlarged cross-sectional view of a second conductive contact of an inspection device according to Embodiment 4 of the present invention.

Embodiment 4 will now be described with reference to FIG. 12.

According to Embodiment 3 described above, the second conductive contact 41 is constituted of the silicon rubber part 43 and a plurality of the metal particle including part 45. According to this Embodiment 4, however, as illustrated in FIG. 12, the second conductive contact 41 is constituted of the silicon rubber part 43 and a plurality of metal wire including parts 53. These metal wire including parts 53 are composed of a metal wire 54 of gold or nickel coated with gold having excellent conductivity, the metal wire 54 being included in silicon rubber in an oblique direction. Accordingly, in the metal wire including part 53, electrical conduction can be achieved only in one direction.

According to Embodiments 3 and 4 described above, the second conductive contact 41 is anisotropic conductive rubber type. However, the first or third conductive contact 11 or 13 may be anisotropic conductive rubber type.

Embodiment 5

Embodiment 5 will now be described with reference to FIGS. 13 to 15.

Figure 13:
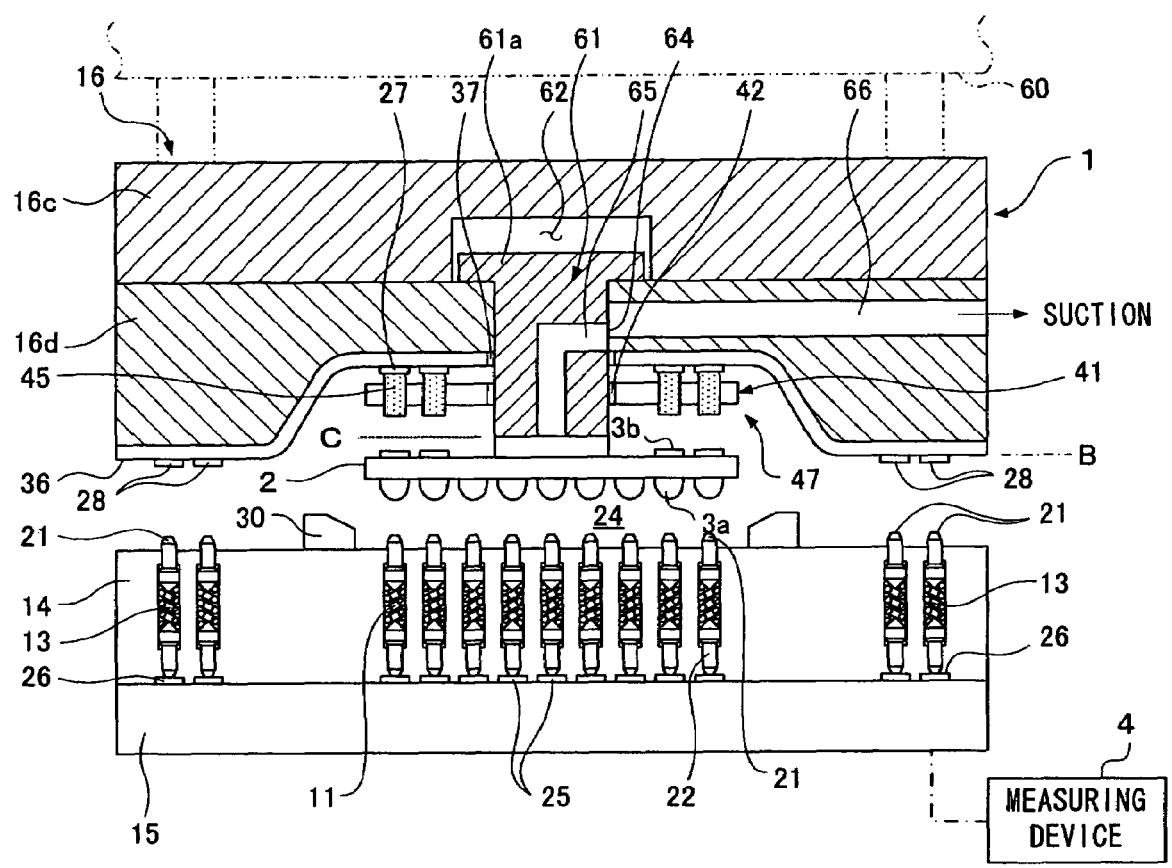
FIG. 13 is a view of an inspection device according to Embodiment 5 of the present invention, illustrating a state in which a semiconductor integrated circuit is adsorbed to cause a movable body to move up to an upper limit position.
Figure 14:
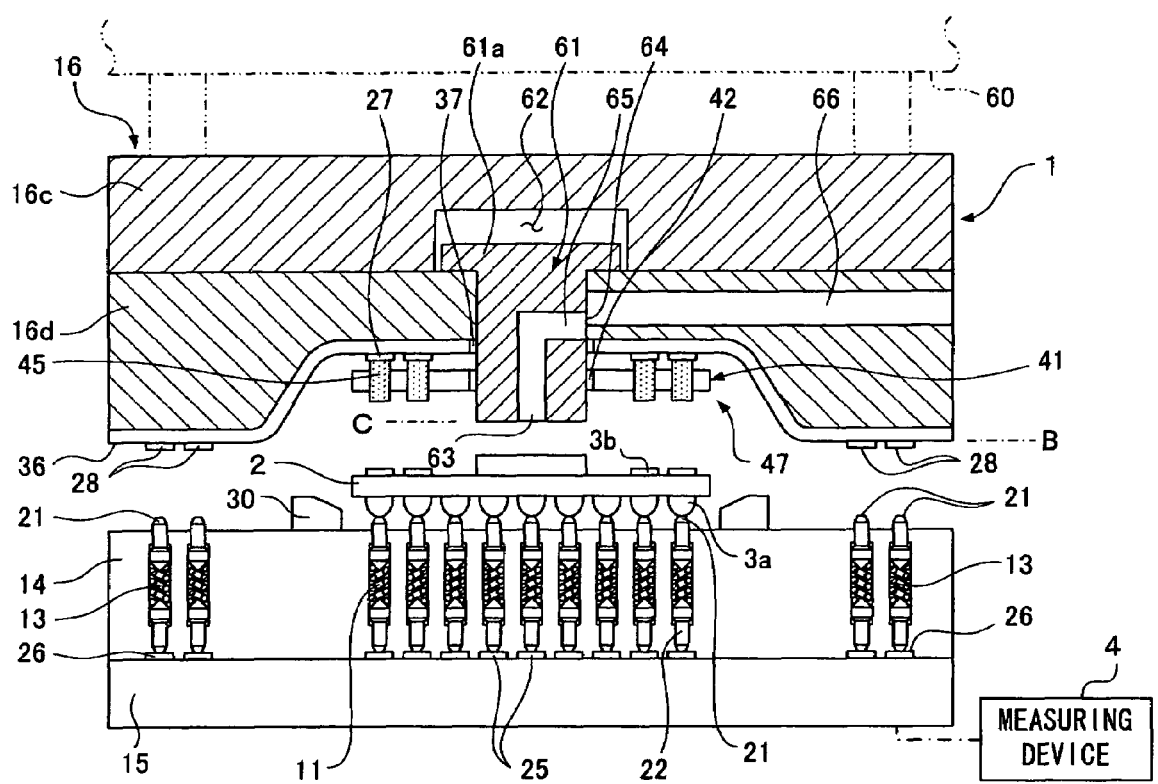
FIG. 14 is a view of the inspection device, illustrating a state in which the semiconductor integrated circuit is made to fall down to be held by a holding part.
Figure 15:
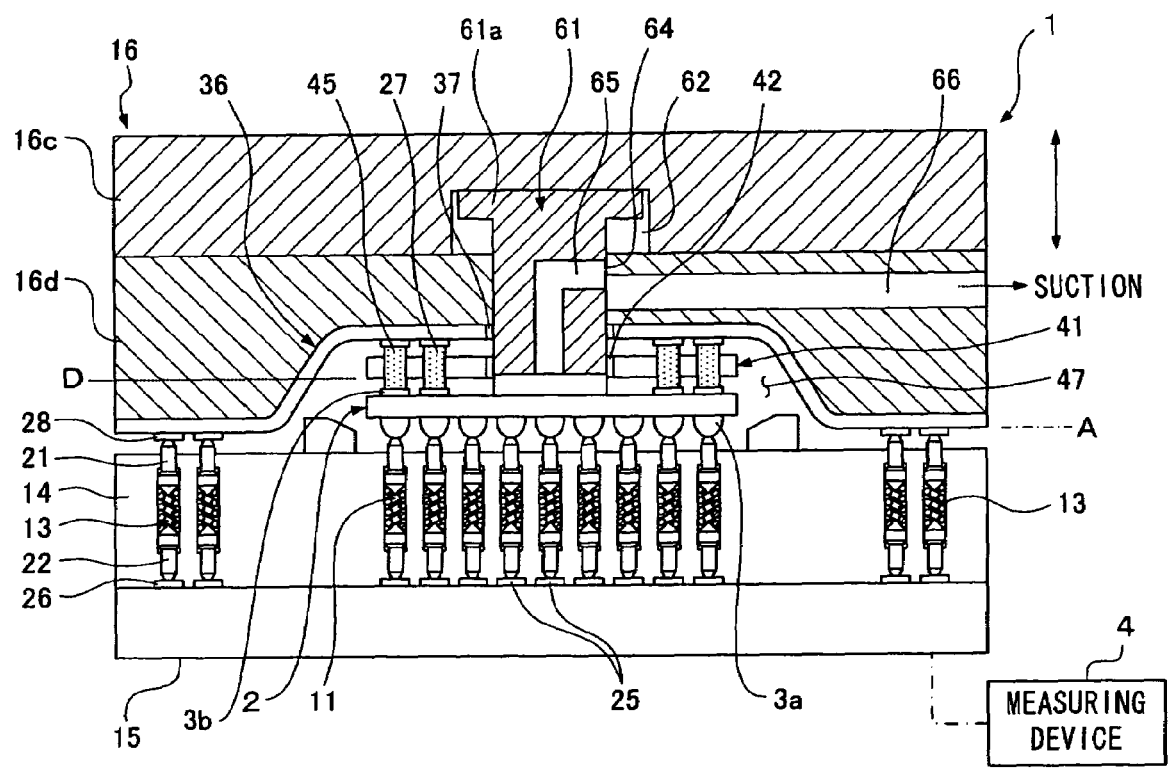
FIG. 15 is a view of the inspection device, illustrating a state in which the movable body is made to move down to a lower limit position.

As illustrated in FIGS. 13 to 15, a movable member 16 is arranged in an automatic conveying device 60 of robot type conveying a semiconductor integrated circuit 2 between a plurality of trays (not illustrated) and a holding part 24 of an inspection device 1.

The movable member 16 is constituted of an upper member 16c in the shape of square board in a plan view and an lower member 16d mounted on a lower face of the upper member 16c. In the movable member 16, there is formed a concave void part 47 having an opening in the lower part thereof. A flexible wiring board 36 is mounted on a lower face (a face opposite to the fixed member 14) of the movable member 16, and a second conductive contact 41 of anisotropic conductive rubber type is mounted on a lower face of the flexible wiring board 36, and the tip end of each of the metal particle including part 45 of the second conductive contact 41 contacts a second land electrode 27 of the flexible wiring board 36.

In the movable member 16, there is held an adsorbing block 61 (an example of adsorbing member) adsorbing the semiconductor integrated circuit 2 between a first conductive contact 11 and the second conductive contact 41. The adsorbing block 61 is fit into a holding hole 62 formed in the movable member 16 and held in a manner movable in a vertical direction (a direction identical to the moving direction of the movable member 16). In the tip end of the adsorbing block 61, there is formed a guard part 61a. As illustrated in FIG. 14, when the adsorbing block 61 moves toward the inspection circuit board 15 side to reach a protruding position C, the lower end of the adsorbing block 61 protrudes below the second conductive contact 41 through a hole 37 of the flexible wiring board 36 and a hole 42 of the second conductive contact 41, and the guard part 61a is engaged with the lower member 16d, whereby the adsorbing block 61 is prevented from moving down.

Also, when the adsorbing block 61 moves up, as illustrated in FIG. 15, toward the movable member 16 side to reach a retreating position D, the lower end of the adsorbing block 61 retreats above the lower end face of the second conductive contact 41 and the upper end face of the adsorbing block 61 makes contact with the top back face of the holding hole 62, whereby the adsorbing block 61 is prevented from moving up.

On the lower end face of the adsorbing block 61, there is formed an adsorbing port 63 (refer to FIG. 14); on the outer circumferential face of the adsorbing block 61, there is formed a sucking port 64. In the interior of the adsorbing block 61, there is formed a squarely bent sucking path 65 communicating with the adsorbing port 63 and the sucking port 64. Also, in the movable member 16, there is formed a vacuum path 66. One end of the vacuum path 66 communicates with the sucking port 64. Also, the other end of the vacuum path 66 is connected through a connection pipe or the like to a vacuum source such as a vacuum pump. The vacuum path 66 is formed so that the length direction thereof is a direction (i.e., lateral direction) orthogonal to the moving direction (i.e., a vertical direction) of the adsorbing block 61.

The operation in the above configuration will be described below.

By use of the automatic conveying device 60, the movable member 16 is conveyed upward of the tray containing a semiconductor integrated circuit 2 to be inspected. When the vacuum pump is activated, the pressure of the vacuum path 66 and sucking path 65 is made to be lower than the atmospheric pressure to adsorb the semiconductor integrated circuit 2 contained in the tray to the adsorbing port 63 of the adsorbing block 61.

Thereafter, as illustrated in FIG. 13, by use of the automatic conveying device 60, the semiconductor integrated circuit 2 is conveyed along with the movable member 16 from above the tray onto the holding part 24 of the inspection device 1. At this time, the movable member 16 is located at the upper limit position B, and due to the own weight of the adsorbing block 61 and the weight of the semiconductor integrated circuit 2, the adsorbing block 61 has moved down to the protruding position C. Accordingly, the semiconductor integrated circuit 2 is adsorbed and held to the adsorbing block 61 while not contacting the second conductive contact 41 and separating downward. Accordingly, a downward contact load by the second conductive contact 41 is not exerted on the semiconductor integrated circuit 2 as a downward reaction force. Consequently, the adsorbing force of the adsorbing block 61 is not cancelled by the above reaction force and exerted on the semiconductor integrated circuit 2. As a result, a stable conveying operation is possible.

Thereafter, as illustrated in FIG. 14, when the vacuum pump is stopped to release the air, the adsorbing by the adsorbing block 61 is released and thus the semiconductor integrated circuit 2 falls down to be held by the holding part 24. Accordingly, each of the one external electrodes 3a of the semiconductor integrated circuit 2 contacts the tip end of the one plunger 21 of the first conductive contact 11.

Thereafter, as illustrated in FIG. 15, when the movable member 16 is made to move down from the upper limit position B to the lower limit position A, the adsorbing block 61 is pushed up from the protruding position C to the retreating position D and thereby retreats, and each of the other external electrodes 3b of the semiconductor integrated circuit 2 contacts the lower end of each of the metal particle including part 45 of the second conductive contact 41 and further, the tip end of the one plunger 21 of each of the third conductive contacts 13 contacts the movable-side fourth land electrode 28 of the flexible wiring board 36.

Accordingly, the one external electrode 3a of the semiconductor integrated circuit 2 is electrically connected through the first conductive contact 11 to the inspection circuit board 15 and at the same time, the other external electrode 3b of the semiconductor integrated circuit 2 is electrically connected through the second conductive contact 41, the flexible wiring board 36 and the third conductive contact 13 to the inspection circuit board 15. Accordingly, the semiconductor integrated circuit 2 and the measuring device 4 are electrically connected, whereby electric characteristics can be inspected for the semiconductor integrated circuit 2.

After completion of the inspection, the vacuum pump is activated to adsorb the semiconductor integrated circuit 2 to the adsorbing port 63. In this state, as illustrated in FIG. 13, the movable member 16 is made to move up from the lower limit position A to the upper limit position B. Accordingly, the one external electrode 3*a* of the semiconductor integrated circuit 2 separates upward from the first conductive contact 11 and at the same time, the movable-side third land electrodes 28 separates from the third conductive contact 13. Further, due to the own weight of the adsorbing block 61 and the weight of the semiconductor integrated circuit 2, the adsorbing block 61 moves down to the protruding position C, and the semiconductor integrated circuit 2 is adsorbed and held to the adsorbing block 61 while not contacting the second conductive contact 41 and separating downward.

Thereafter, by use of the automatic conveying device 60, the semiconductor integrated circuit 2 is conveyed along with the movable member 16 upward of another vacant tray. Then, when the vacuum pump is stopped to release the air, the adsorbing by the adsorbing block 61 is released to move the semiconductor integrated circuit 2 which has been inspected, from the adsorbing block 61 into the vacant tray.

While the adsorbing block 61 moves up and down between the protruding position C and the retreating position D, the vacuum path 66 communicates from a lateral direction with the sucking port 64 of the adsorbing block 61. Accordingly, the length direction of the vacuum path 66 is not identical with the moving direction of the adsorbing block 61, being a direction dislocated by 90 degrees. Consequently, when the vacuum pump is activated to cause a sucking force to be generated, vertical movement of the adsorbing block 61 is not interrupted by the above sucking force.

Embodiment 6

Embodiment 6 will now be described with reference to FIGS. 16A, 16B and 17.

Figure 16A:
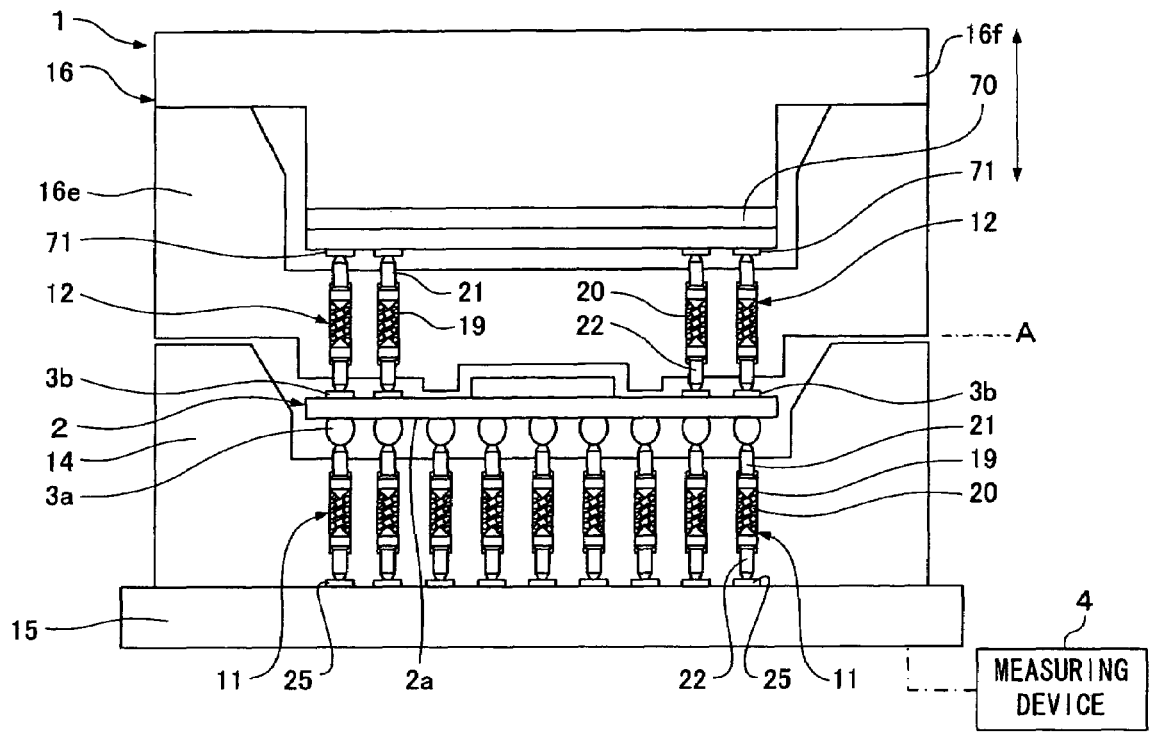
FIG. 16A is a view of an inspection device according to Embodiment 6 of the present invention, illustrating a state in which a movable body is made to move down to a lower limit position.
Figure 16B:
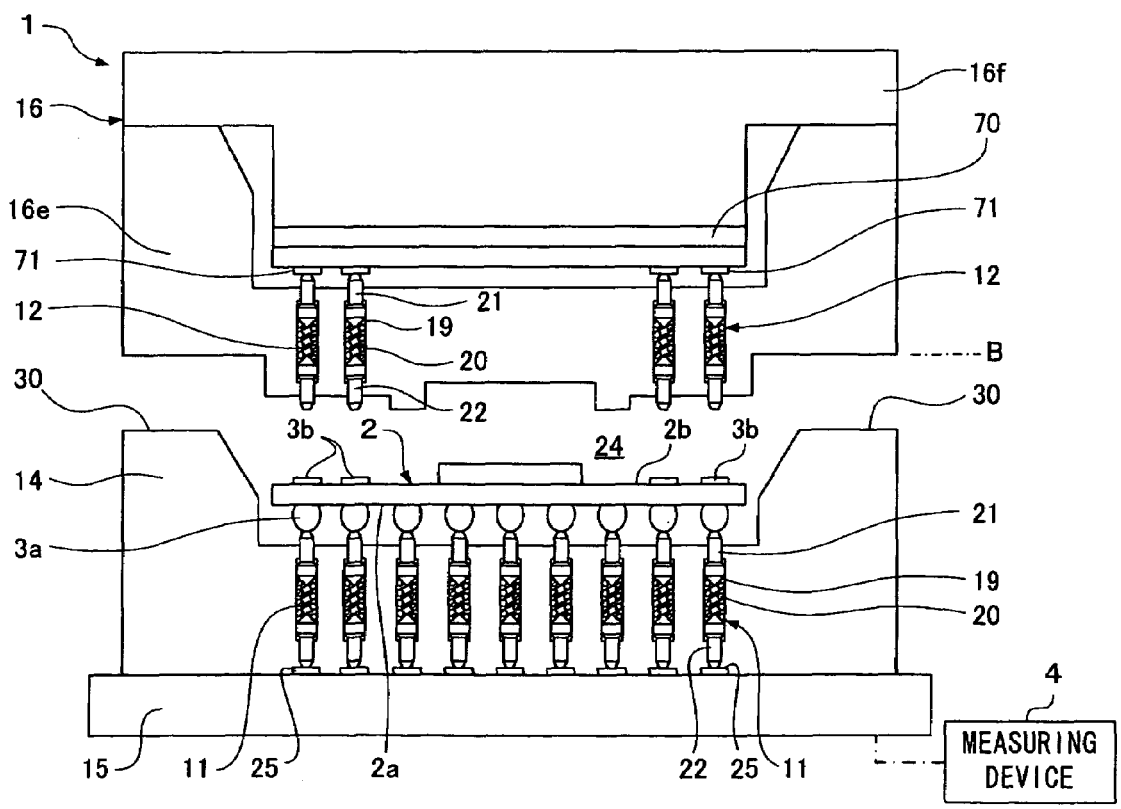
FIG. 16B is a view of an inspection device according to Embodiment 6 of the present invention, illustrating a state in which the movable body is made to move up to a higher limit position.

As illustrated in FIGS. 16A and 16B, an inspection device 1 includes first and second conductive contacts 11 and 12 of pogopin type (spring-incorporating contact pin), a fixed member 14, an inspection circuit board 15 connected to a measuring device 4, a movable member 16 and an inspection-use semiconductor integrated circuit 70.

The inspection-use semiconductor integrated circuit 70 is arranged above the inspection circuit board 15, facing the inspection circuit board 15. The inspection circuit board 15 is arranged detachably in a lower part of the fixed member 14 by use of a screw (not illustrated) or the like. On the upper face of the inspection circuit board 15, there are formed a plurality of first land electrodes 25 (an example of first electrode)

The conductive contacts 11 and 12 are each constituted of, similarly to prior art, a cylinder body 19, a compression spring 20, one plunger 21 and the other plunger 22. The plungers 21 and 22 are each coated with gold.

The first conductive contact 11 serves to make contact with the first land electrode 25 of the inspection circuit board 15 and the one external electrode 3*a* of the semiconductor integrated circuit 2 to electrically connect these electrodes 25 and 3*a*. A plurality of the first conductive contacts 11 are arranged in the fixed member 14 with the one plunger 21 facing upward and the other plunger 22 facing downward.

The fixed member 14 is constituted of a frame being square in a plan view. In an upper part of the fixed member 14 (i.e., between the inspection circuit board 15 and the inspection-use semiconductor integrated circuit 70), there are arranged a holding part 24 holding the semiconductor integrated circuit 2 and a protruding part 30 for locating the semiconductor integrated circuit 2 in the holding part 24. The protruding parts 30 are arranged so as to surround the periphery of the holding part 24. In the holding part 24, the semiconductor integrated circuit 2 is supported by the first conductive contact 11.

The movable member 16 is constituted of a main body frame 16*e* being square in a plan view and a cover 16*f* mounted detachably in an upper part of the main body frame 16*e*. The movable member 16 is movable in a vertical direction relative to the fixed member 14, and a drive device, constituted of a cylinder, a motor or the like, for moving up and down the movable member 16 is arranged.

The inspection-use semiconductor integrated circuit 70 is mounted detachably in a lower part of the cover 16*f* of the movable member 16. The inspection-use semiconductor integrated circuit 70 has a structure similar to that of another semiconductor integrated circuit stacked on the semiconductor integrated circuit 2 by use of a package-on-package technique. Also, the inspection-use semiconductor integrated circuit 70 has a plurality of inspection-use external electrodes 71 on the lower face thereof (i.e., a face opposite to the inspection circuit board 15). These inspection-use external electrodes 71 are flat in shape, the base material thereof being made of copper or tungsten, the surface thereof being coated with gold.

Each of the second conductive contacts 12 serves to make contact with the inspection-use external electrode 71 of the inspection-use semiconductor integrated circuit 70 and the other external electrode 3*b* of the semiconductor integrated circuit 2 to electrically connect these electrodes 71 and 3*b*. A plurality of the second conductive contacts 12 are arranged in the main body frame 16*e* of the movable member 16.

The movable member 16 moves up and down between a lower limit position A (an example of contacting position) and an upper limit position B (an example of separating position). As illustrated in FIG. 16A, at the lower limit position A, the second conductive contact 12 makes contact with the other external electrode 3*b* of the semiconductor integrated circuit 2; as illustrated in FIG. 16B, at the upper limit position B, the second conductive contact 12 separates upward from the other external electrode 3*b*.

The operation in the above configuration will be described below.

As illustrated in FIG. 16B, in a state in which the movable member 16 is made to move up to the upper limit position B, the tip end of the other plunger 22 of each of the first conductive contacts 11 contacts the first land electrode 25, and also the tip end of the one plunger 21 of each of the second conductive contact 12 contacts the inspection-use external electrode 71 of the inspection-use semiconductor integrated circuit 70.

In this state, when the semiconductor integrated circuit 2 is placed in the holding part 24, the one external electrode 3*a* of the semiconductor integrated circuit 2 contacts the tip end of the one plunger 21 of each of the first conductive contacts 11.

Thereafter, as illustrated in FIG. 16A, when the movable member 16 is made to move down from the upper limit position B to the lower limit position A, the tip end of the other plunger 22 of each of the second conductive contacts 12 contacts the other external electrode 3*b* of the semiconductor integrated circuit 2.

Accordingly, the one external electrode 3*s* of the semiconductor integrated circuit 2 is electrically connected through the first conductive contact 11 to the inspection circuit board 15 and at the same time, the other external electrode 3b of the semiconductor integrated circuit 2 is electrically connected through the second conductive contact 12 to the inspection-use semiconductor integrated circuit 70, whereby electric characteristics can be inspected for the semiconductor integrated circuit 2.

Consequently, as with the prior art, there is no need to add to the one face 2a of the semiconductor integrated circuit 2 an inspection-use external electrode electrically connected to the other external electrode 3b. Accordingly, the increase in the number of external electrodes can be prevented and the overall size of the semiconductor integrated circuit 2 can be prevented from becoming larger, allowing achievement of effects of high density achieved by stacking.

Also, when the movable member 16 is made to move down to the lower limit position A as described above, the compression spring 20 in each of the conductive contacts 11 and 12 is compressed and due to a repulsive force of these compression springs 20, there is generated a contact load of the plungers 21 and 22 of each of the conductive contacts 11 and 12, the contact load being exerted on the respective electrodes 3a, 3b, 25 and 71. Accordingly, the plungers 21 and 22 of each of the conductive contacts 11 and 12 are pressed against the respective electrodes 3a, 3b, 25 and 71, thus allowing achievement of stable electrical conduction.

After completion of the inspection, when the movable member 16 is made to move up from the lower limit position A to the upper limit position B, the tip end of the other plunger 22 of each of the second conductive contact 12 separates upward from the other external electrode 3b of the semiconductor integrated circuit 2.

Also, the inspection-use external electrode 71 of the inspection-use semiconductor integrated circuit 70 is flat in shape and coated with gold and thus, the contacting part between the inspection-use external electrode 71 and the one plunger 21 coated with gold of the second conductive contact 12 constitutes a gold-to-gold contact, so that the contact resistance thereof is small and thus, satisfactory electrical conduction is achieved. Consequently, electric characteristics can be inspected in a stable manner.

Also, the contact resistance between the inspection-use external electrode 71 of the inspection-use semiconductor integrated circuit 70 and the second conductive contact 12 is smaller than the contact resistance between the external electrode 3a of the semiconductor integrated circuit 2 to be inspected and the first conductive contact 11. Thus, electric characteristics can be accurately inspected for the semiconductor integrated circuit 2.

A method for inspecting a semiconductor integrated circuit 2 using the inspection device 1 will now be described.

As described above, while the semiconductor integrated circuit 2 is held by the holding part 24, the movable member 16 is made to move down to the lower limit position A to electrically connect through the first conductive contact 11 the first land electrodes 25 of the inspection circuit board 15 and the one external electrode 3a of the semiconductor integrated circuit 2 and at the same time, to electrically connect through the second conductive contact 12 the inspection-use external electrode 71 of the inspection-use semiconductor integrated circuit 70 and the other external electrode 3b of the semiconductor integrated circuit 2.

Figure 17:
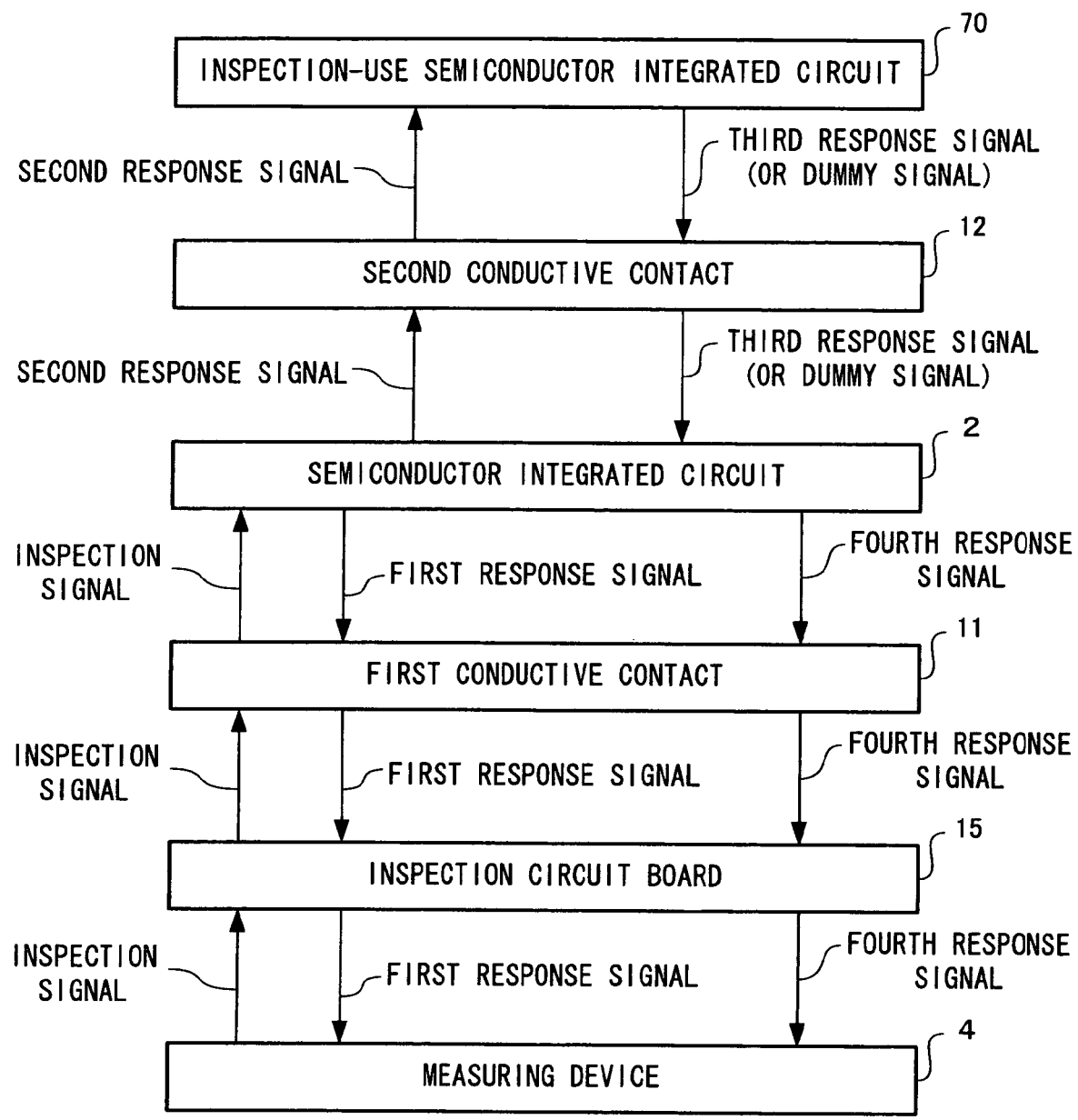
FIG. 17 is a block diagram illustrating a signal transmission path of the inspection device.

Then, as illustrated in FIG. 17, an inspection signal is supplied from the measuring device 4 through the first conductive contact 11 to the one external electrode 3a of the semiconductor integrated circuit 2 for a given time period, and a first response signal with respect to the inspection signal is received from the one external electrode 3a of the semiconductor integrated circuit 2 through the first conductive contact 11 by the measuring device 4.

Further, a second response signal is supplied from the other external electrode 3b of the semiconductor integrated circuit 2 through the second conductive contact 12 to the inspection-use external electrode 71 of the inspection-use semiconductor integrated circuit 70, and a third response signal with respect to the second response signal, or a dummy signal is outputted from the inspection-use semiconductor integrated circuit 70 through the second conductive contact 12 to the other external electrode 3b of the semiconductor integrated circuit 2.

Then, a fourth response signal with respect to the third response signal or the dummy signal is received from the one external electrode 3a of the semiconductor integrated circuit 2 through the first conductive contact 11 by the measuring device 4. When the first response signal and fourth response signal received by the measuring device 4 are measured and a measurement result is determined, electric characteristics of the semiconductor integrated circuit 2 are inspected.

When an electrical connection between the inspection circuit board 15 and the inspection-use semiconductor integrated circuit 70 is separately made, fault diagnosis of the inspection-use semiconductor integrated circuit 70 can also be performed. In the event that the inspection-use semiconductor integrated circuit 70 is in a failed state, the inspection-use semiconductor integrated circuit 70 is removed from the cover 16f of the movable member 16 to replace it with a normal inspection-use semiconductor integrated circuit 70.

Embodiment 7

Embodiment 7 according to the present invention will be described.

Figure 18A:
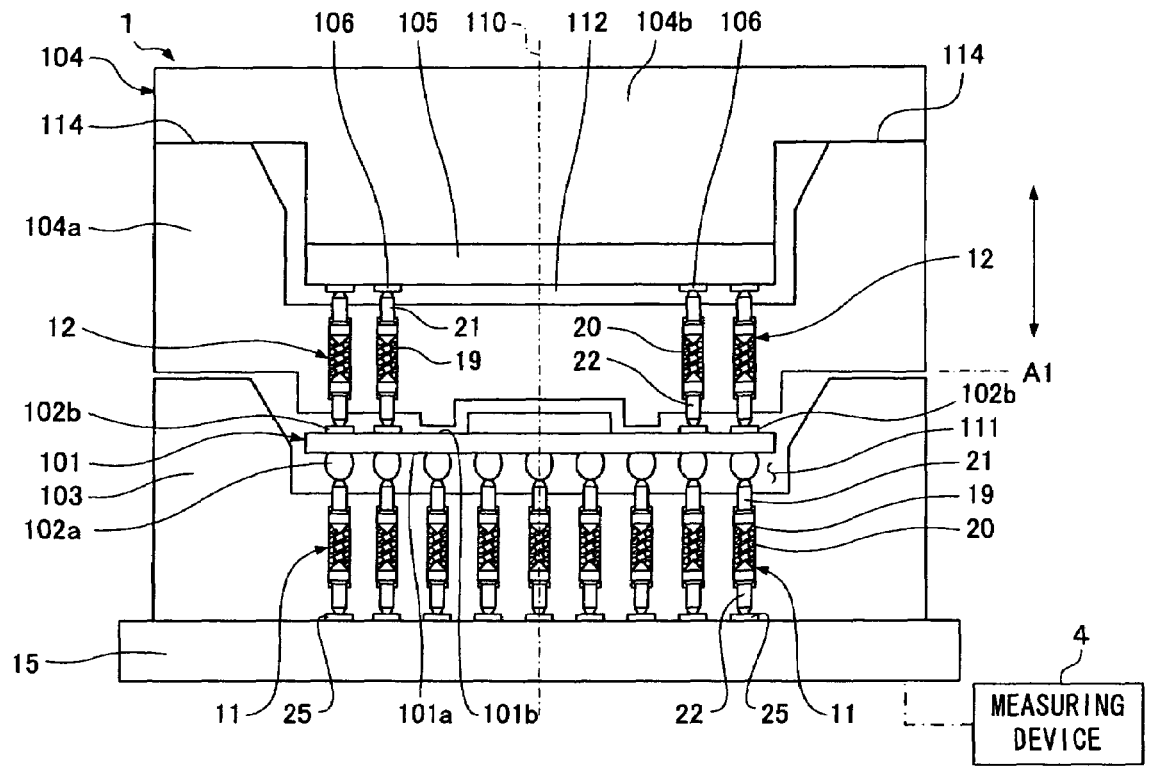
FIG. 18A is a view of an inspection device when a first semiconductor integrated circuit according to Embodiment 7 of the present invention is inspected, illustrating a state in which a movable frame is made to move down to a first lower limit position.
Figure 18B:
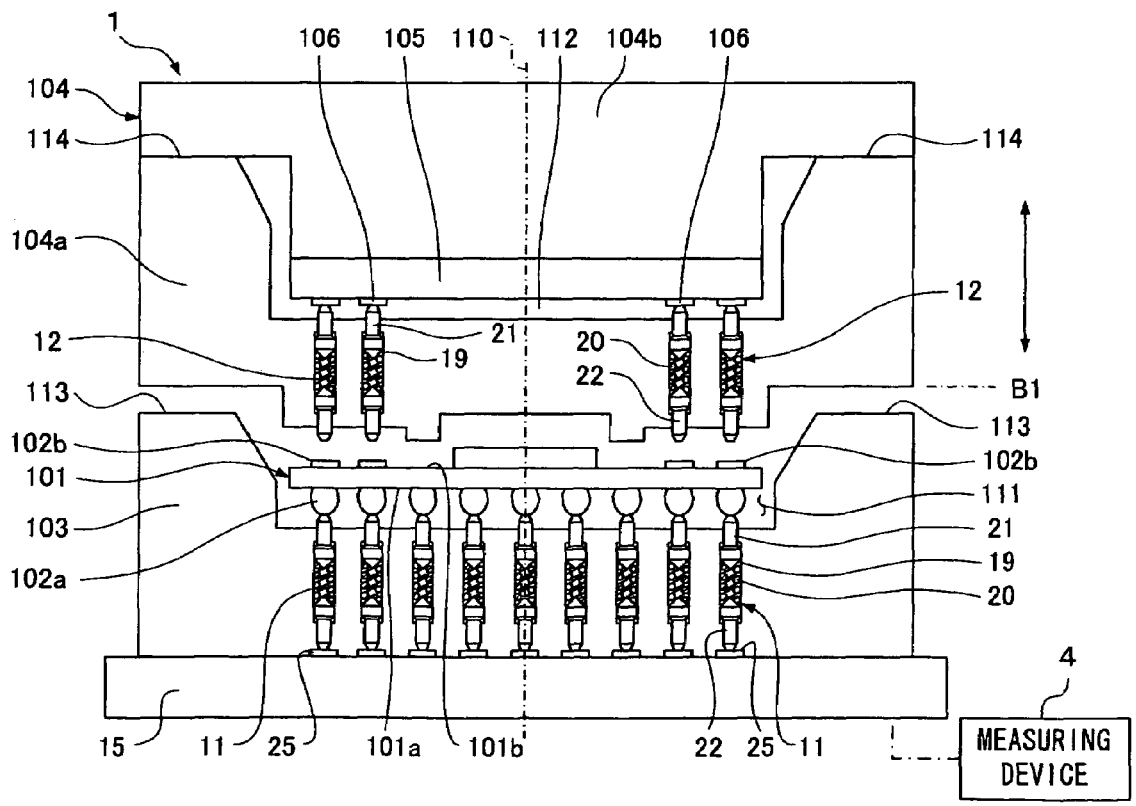
FIG. 18B is a view of an inspection device when a first semiconductor integrated circuit according to Embodiment 7 of the present invention is inspected, illustrating a state in which the movable frame is made to move up to a first upper limit position.

As illustrated in FIGS. 18A, 18B and 19, in an inspection device 1, electric characteristics can be inspected for one of, or both of the semiconductor integrated circuits (a first semiconductor integrated circuit 101 and a second semiconductor integrated circuit 105). The first semiconductor integrated circuit 101 has a plurality of one external electrodes 102a on one face 101a thereof and a plurality of the other external electrodes 102b on the other face 101b thereof. The second semiconductor integrated circuit 105 is stacked on the first semiconductor integrated circuit 101 by a package-on-package technique and has a plurality of external electrodes 106 only on one face (lower face) thereof.

The inspection device 1 includes an inspection circuit board 15, first and second conductive contacts 11 and 12 of pogopin type, the first semiconductor integrated circuit 101, the second semiconductor integrated circuit 105, a fixed member 103 and a movable member 104.

The fixed member 103 has a frame configuration being square in a plan view and arranged between the inspection circuit board 15 and the movable member 104.

The inspection circuit board 15 is arranged detachably in a lower part of the fixed member 103 by a screw (not illustrated) or the like. On the upper face of the inspection circuit board 15, there are formed a plurality of first land electrodes 25 (an example of first electrode). Also, a measuring device 4 is connected to the inspection circuit board 15.

The movable member 104 is vertically movable on a movement path 110 on which the movable member 104 approaches or separates from the fixed member 103, and constituted of a movable frame 104a (an example of first movable body) and a movable cover 104b (an example of second movable body) movable separately from each other. The movable cover 104b is positioned above the fixed member 103, facing the fixed member 103 and arranged so as to cover the upper part of the movable frame 104a. The movable frame 104a is formed into a square in a plan view and arranged between the movable cover 104b and the fixed member 103.

Between the fixed member 103 and the movable frame 104a, there is formed a first holding part 111; the first semiconductor integrated circuit 101 is held by the first holding part 111. In an upper part of the fixed member 103, there is arranged a first protruding part 113 locating the first semiconductor integrated circuit 101 in the first holding part 111. The first protruding part 113 is arranged so as to surround the periphery of the first holding part 111.

Between the movable frame 104a and the movable cover 104b, there is formed a second holding part 112; the second semiconductor integrated circuit 105 is held by the second holding part 112. In an upper part of the movable frame 104a, there is arranged a second protruding part 114 locating the second semiconductor integrated circuit 105 in the second holding part 112. The second protruding part 114 is arranged so as to surround the periphery of the second holding part 112.

The first conductive contact 11 serves to make contact with the first land electrode 25 and the one external electrode 102a of the first semiconductor integrated circuit 101 to electrically connect these electrodes 25 and 102a. A plurality of the first conductive contacts 11 are arranged in the fixed member 103. One plunger 21 of each of the first conductive contacts 11 is made to face upward and the other plunger 22 thereof is made to face downward. As illustrated in FIG. 18B, in the first holding part 111, the first semiconductor integrated circuit 101 is supported by the first conductive contact 11.

The second conductive contact 12 serves to make contact with the other external electrode 102b of the first semiconductor integrated circuit 101 and the external electrode 106 of the second semiconductor integrated circuit 105 to electrically connect these electrodes 102b and 106. A plurality of the second conductive contacts 12 are arranged in the movable frame 104a. As illustrated in FIG. 19B, in the second holding part 112, the second semiconductor integrated circuit 105 is supported by the second conductive contact 12.

The first and second conductive contacts 11 and 12 are each constituted of a cylinder body 19, a compression spring 20, one plunger 21 and the other plunger 22. The plungers 21 and 22 are each coated with gold.

The movable frame 104a and movable cover 104b of the movable member 104 are separately moved on the movement path 110 by a drive device (not illustrated) constituted of a cylinder, a motor or the like. More specifically, the movable frame 104a is movable, along with the movable cover 104b, to a first lower limit position A1 (an example of first contacting position) illustrated in FIG. 18A and a first upper limit position B1 (an example of first separating position) illustrated in FIG. 18B.

As illustrated in FIG. 18A, when the movable frame 104a moves to the first lower limit position A1, the other plunger 22 of the second conductive contact 12 makes contact with the other external electrode 102b of the first semiconductor integrated circuit 101. Also, as illustrated in FIG. 18B, when the movable frame 104a moves to the first upper limit position B1, the second conductive contact 12 separates upward from the other external electrode 102b.

Figure 19A:
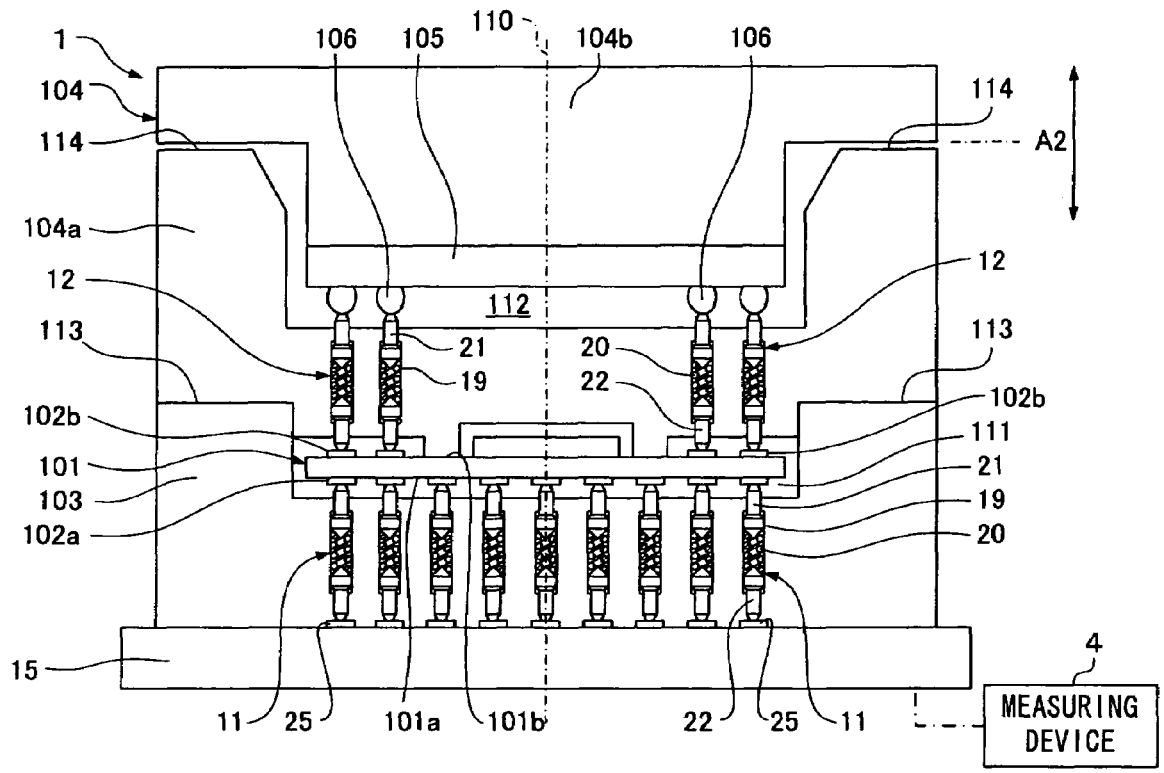
FIG. 19A is a view of the inspection device when a second semiconductor integrated circuit is inspected, illustrating a state in which a movable cover is made to move down to a second lower limit position.
Figure 19B:
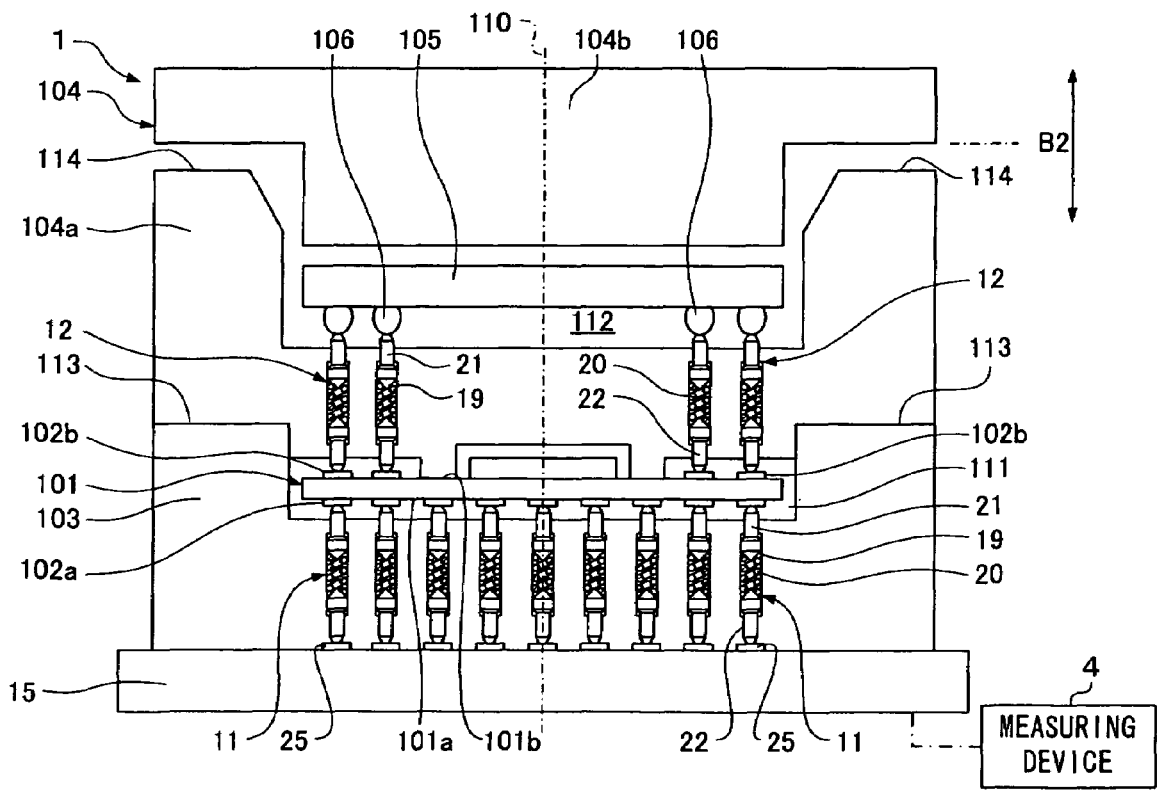
FIG. 19B is a view of the inspection device when a second semiconductor integrated circuit is inspected, illustrating a state in which the movable cover is made to move up to a second upper limit position.
Figure 20:
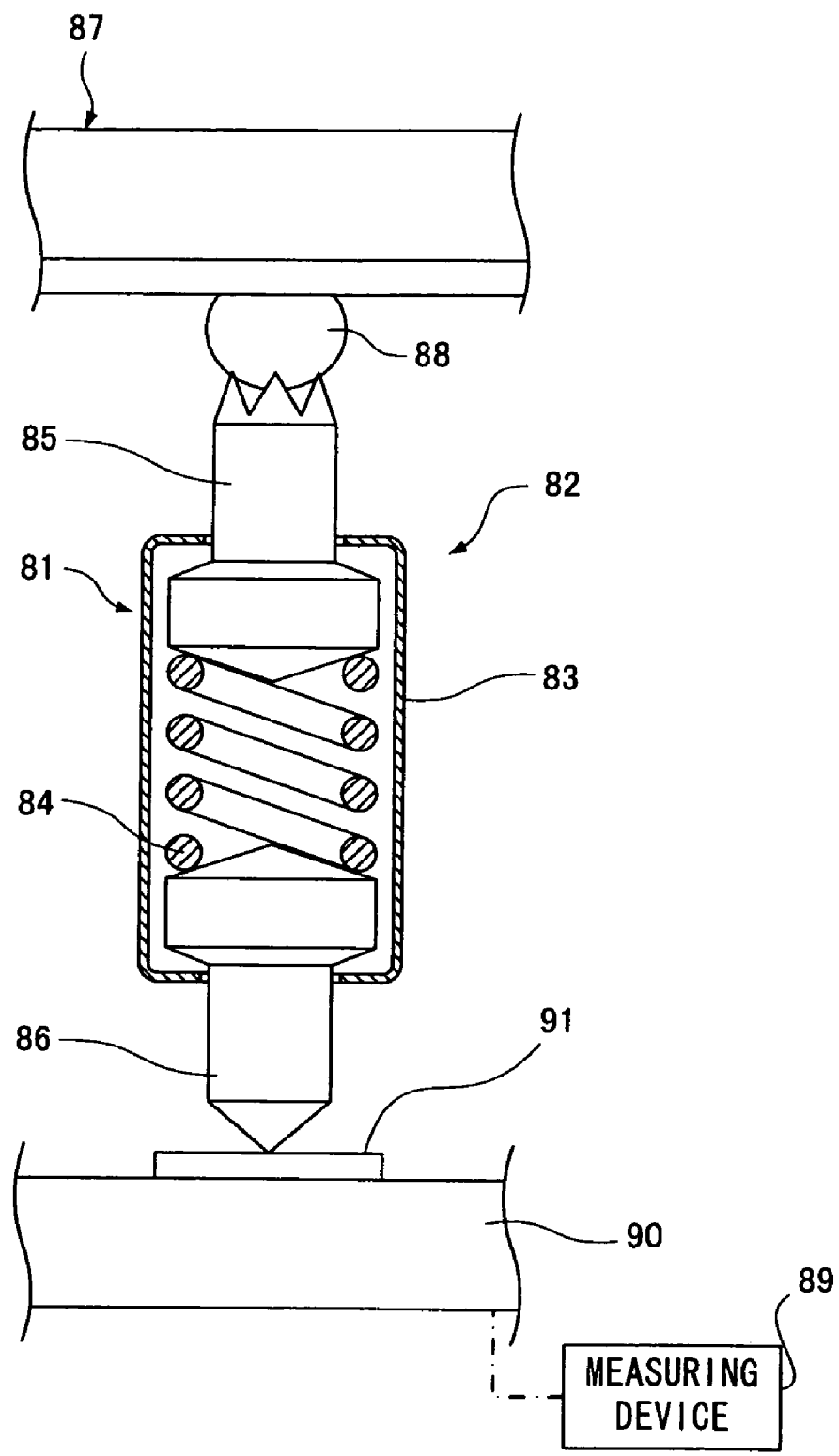
FIG. 20 is a partial enlarged view of a conductive contact of a prior art inspection device.
Figure 21:
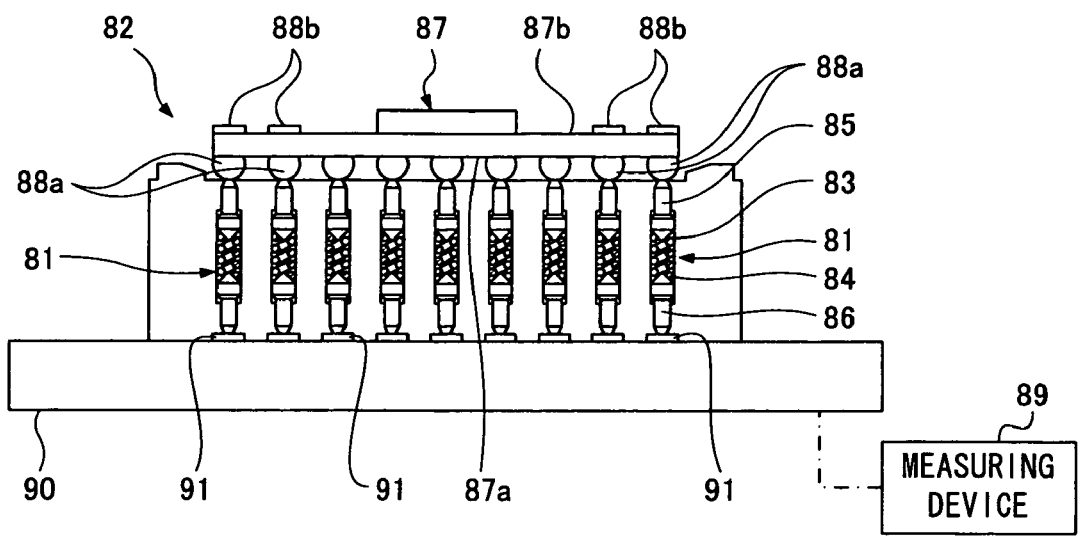
FIG. 21 is a view of the prior art inspection device, illustrating a state in which a semiconductor integrated circuit having external electrodes on two opposite faces thereof is set.
Figure 22:
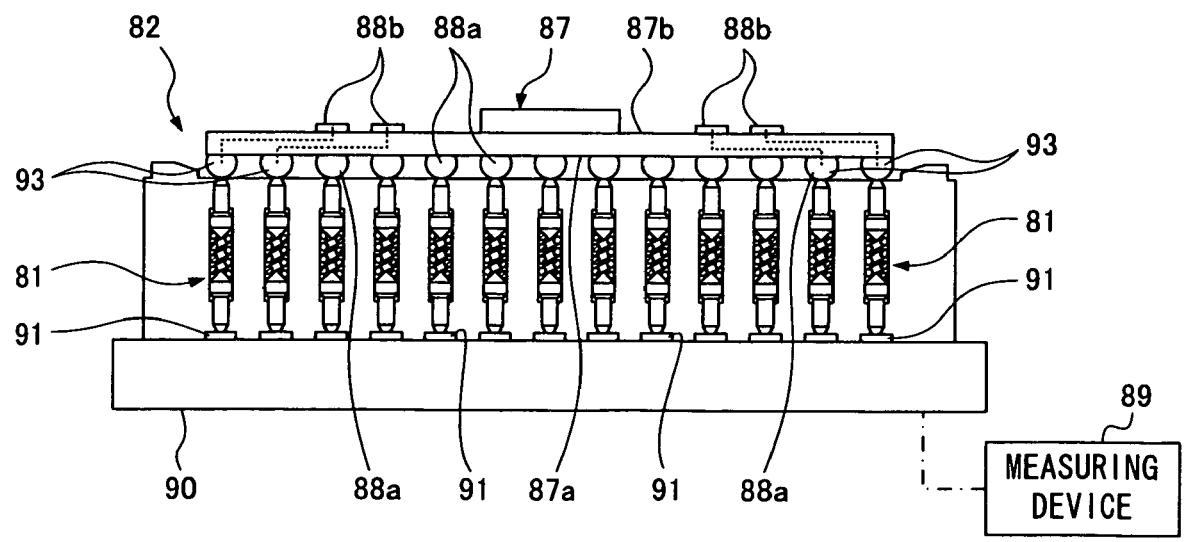
FIG. 22 is a view illustrating a method for inspecting the semiconductor integrated circuit having external electrodes on two opposite faces thereof by use of the prior art inspection device.

Also, the movable cover 104b is movable to a second lower limit position A2 (an example of second contacting position) illustrated in FIG. 19A and to a second upper limit position B2 (an example of second separating position) illustrated in FIG. 19B.

As illustrated in FIG. 19A, when the movable cover 104b moves to the second lower limit position A2, the movable cover 104b makes contact with the second semiconductor integrated circuit 105 held by the second holding part 112, and the external electrode 106 of the second semiconductor integrated circuit 105 is pressed against the one plunger 21 of the second conductive contact 12. Also, as illustrated in FIG. 19B, when the movable cover 104b moves to the second upper limit position B2, the movable cover 104b separates upward from the second semiconductor integrated circuit 105.

The operation in the above configuration will be described below.

When electric characteristics are not inspected for the second semiconductor integrated circuit 105 but inspected for the first semiconductor integrated circuit 101, the movable cover 104b is preliminarily moved up to the upper limit position B2 to cause the second holding part 112 to hold the second semiconductor integrated circuit 105, and then the movable cover 104b is made to moved own to the second lower limit position A2. Accordingly, as illustrated in FIG. 18B, the movable cover 104b makes contact with the second semiconductor integrated circuit 105, and the external electrode 106 of the second semiconductor integrated circuit 105 is pressed against the one plunger 21 of the second conductive contact 12.

In this case, as illustrated in FIGS. 18A and 18B, the external electrode 106 of the second semiconductor integrated circuit 105 to be not inspected is flat in shape, the base material thereof being made of copper or tungsten, the surface thereof being coated with gold.

Thereafter, as illustrated in FIG. 18B, the movable frame 104a is made to move up, integrally with the movable cover 104b, to the first upper limit position B1, and the first semiconductor integrated circuit 101 to be inspected is made to held by the first holding part 111. Accordingly, the first conductive contact 11 makes contact with the first land electrode 25 of the inspection circuit board 15 and the one external electrode 102a of the first semiconductor integrated circuit 101.

Then, as illustrated in FIG. 18A, the movable frame 104a is made to be moved down, integrally with the movable cover 104b, to the first lower limit position A1. Accordingly, the other plunger 22 of the second conductive contact 12 makes contact with the other external electrode 102b of the first semiconductor integrated circuit 101, so that the first conductive contact 11 connects the first land electrode 25 of the inspection circuit board 15 and the one external electrode 102a of the first semiconductor integrated circuit 101 and at the same time, the second conductive contact 12 connects the other external electrode 102b of the first semiconductor integrated circuit 101 and the external electrode 106 of the second semiconductor integrated circuit 105.

Accordingly, the one external electrode 102a of the first semiconductor integrated circuit 101 is electrically connected through the first conductive contact 11 to the inspection circuit board 15 and at the same time, the other external electrode 102b of the first semiconductor integrated circuit 101 is electrically connected through the second conductive contact 12 to the second semiconductor integrated circuit 105, whereby electric characteristics can be inspected for the first semiconductor integrated circuit 101.

Thereafter, as illustrated in FIG. 18B, the movable frame 104a is made to move up, integrally with the movable cover 104b, from the first lower limit position A1 to the first upper limit position B1, and the first semiconductor integrated circuit 101 which has been inspected is removed from the first holding part 111, and another first semiconductor integrated circuit 101 to be inspected is made to be held by the first holding part 111, and this first semiconductor integrated circuit 101 is inspected by a procedure similar to the one described above.

In this case, the external electrode 106 of the second semiconductor integrated circuit 105 to be not inspected is flat in shape and coated with gold and thus, when the external electrode 106 makes contact with the one plunger 21 coated with gold of the second conductive contact 12, this constitutes a gold-to-gold contact, so that the contact resistance thereof is small and thus, satisfactory electrical conduction is achieved. Consequently, electric characteristics can be inspected in a stable manner.

Also, the contact resistance between the external electrode 106 of the second semiconductor integrated circuit 105 and the second conductive contact 12 is smaller than the contact resistance between the external electrode 102a of the first semiconductor integrated circuit 101 to be inspected and the first conductive contact 11, so that electric characteristics can be accurately inspected for the first semiconductor integrated circuit 101.

When electric characteristics are not inspected for the first semiconductor integrated circuit 101 but inspected for the second semiconductor integrated circuit 105, the movable frame 104a is preliminarily made to move up, integrally with the movable cover 104b, to the first upper limit position B1 to cause the first holding part 111 to hold the first semiconductor integrated circuit 101, and the movable cover 104b is made to move down, integrally with the movable cover 104b, to the first lower limit position A1. Accordingly, the other plunger 22 of the second conductive contact 12 makes contact with the other external electrode 102b of the first semiconductor integrated circuit 101 and at the same time, the first conductive contact 11 connects the first land electrodes 25 of the inspection circuit board 15 and the one external electrode 102a of the first semiconductor integrated circuit 101.

In this case, as illustrated in FIGS. 19A and 19B, the external electrodes 102a and 102b of the first semiconductor integrated circuit 101 to be not inspected are flat in shape, the base material thereof being made of copper or tungsten, the surface thereof being coated with gold.

Thereafter, as illustrated in FIG. 19B, the movable cover 104b is made to move up to the second upper limit position B2, and the second semiconductor integrated circuit 105 to be inspected is made to be held by the second holding part 112. Accordingly, the one plunger 21 of the second conductive contact 12 makes contact with the external electrode 106 of the second semiconductor integrated circuit 105.

Then, as illustrated in FIG. 19A, the movable cover 104b is made to move down to the second lower limit position A2. Accordingly, the movable cover 104b makes contact with the second semiconductor integrated circuit 105, and the external electrode 106 of the second semiconductor integrated circuit 105 is pressed against the one plunger 21 of the second conductive contact 12. Thus, the second conductive contact 12 connects the external electrode 106 of the second semiconductor integrated circuit 105 and the other external electrode 102b of the first semiconductor integrated circuit 101.

Accordingly, the one external electrode 102a of the first semiconductor integrated circuit 101 is electrically connected through the first conductive contact 11 to the inspection circuit board 15 and at the same time, the external electrode 106 of the second semiconductor integrated circuit 105 is electrically connected through the second conductive contact 12 to the other external electrode 102b of the first semiconductor integrated circuit 101, whereby electric characteristics can be inspected for the second semiconductor integrated circuit 105.

Thereafter, as illustrated in FIG. 19B, the movable cover 104b is made to move up from the second lower limit position A2 to the second upper limit position B2, and the second semiconductor integrated circuit 105 which has been inspected is removed from the second holding part 112, and another second semiconductor integrated circuit 105 to be inspected is made to be held by the second holding part 112, and this second semiconductor integrated circuit 105 is inspected by a procedure similar to the one described above.

In this case, the external electrodes 102a and 102b of the first semiconductor integrated circuit 101 to be not inspected are flat in shape and coated with gold and thus, when the external electrode 102a makes contact with the one plunger 21 coated with gold of the first conductive contact 11, this constitutes a gold-to-gold contact, so that the contact resistance thereof is small and thus, satisfactory electrical conduction is achieved. Consequently, electric characteristics can be inspected in a stable manner.

Also, the contact resistance between the external electrode 102a of the first semiconductor integrated circuit 101 to be not inspected and the first conductive contact 11 is smaller than the contact resistance between the external electrode 106 of the second semiconductor integrated circuit 105 to be inspected and the second conductive contact 12, so that electric characteristics can be accurately inspected for the second semiconductor integrated circuit 105.

For the external electrode 102a of the first semiconductor integrated circuit 101 and the external electrode 106 of the second semiconductor integrated circuit 105, the base material thereof is made of copper or tungsten and higher in hardness than a solder ball electrode or the like often used as the electrode and thus, hardly changed in shape by the contact with the conductive contacts 11 and 12. Consequently, stable electrical conduction is achieved for a long time.

As described above, the inspection device according to the present invention is appropriate for inspecting a semiconductor integrated circuit having electrodes on two opposite faces thereof.

What is claimed is:

1. An inspection device for inspecting electric characteristics of a semiconductor integrated circuit having a first external electrode on a first surface and a second external electrode on a second surface, said first and second surfaces being opposite to each other, said inspection device comprising:
    an inspection circuit board having a first electrode;
    a wiring board having a second electrode, said inspection circuit board and wiring board arranged such that the first and second electrodes face each other, and the wiring board is located in a moveable member, which is moveable relative to the inspection circuit board;
    a measuring device connected to the inspection circuit board;
    a holding part for holding the semiconductor integrated circuit located between the inspection circuit board and the wiring board;
    a first conductive contact pin for contacting the first electrode of the inspection circuit board and the first external electrode of the semiconductor integrated circuit facing the inspection circuit board, said first conductive contact pin located in a fixed member, which is fixed relative to the inspection circuit board;
    a second conductive contact pin for contacting the second electrode of the wiring board and a second external electrode of the semiconductor integrated circuit facing the wiring board, the second conductive contact pin located in the movable member;
    a third electrode located on the inspection circuit board;

a fourth electrode located on the wiring board, said fourth electrode electrically connected to the second electrode via a wiring circuit located in the wiring board; and a third conductive contact pin for independently connecting the third and fourth electrodes, said third conductive contact pin located in the movable member, wherein the wiring board has a planar surface and the second and fourth electrodes are located on the planar surface, such that the second and fourth electrodes are located along the same plane, the moveable member is moveable to a contacting position in which the second conductive contact pin contacts a second external electrode of the semiconductor integrated circuit, the moveable member is movable to a separated position at which the second conductive contact pin is separated from such second external electrode, and the third conductive contact pin contacts the third electrode and the fourth electrode when the movable member is in the contacting position.

2. The inspection device according to claim 1, wherein characteristic impedance of the wiring board is matched to characteristic impedance of the inspection circuit board or the measuring device.

3. The inspection device according to claim 2, wherein the length of the conductive contact pin and second the overall length of the second conductive contact pin and the height of the semiconductor integrated circuit.

4. The inspection device according to claim 1, wherein at least one of the first to third conductive contact pin is an anisotropic conductive rubber type.

5. The inspection device according to claim 1, wherein the movable member is arranged in a conveying device conveying the semiconductor integrated circuit onto the holding part;

an adsorbing member adsorbing the semiconductor integrated circuit between the first conductive contact pin is located in the movable member;

the adsorbing member is movable between a protruding position protruding toward the inspection circuit board side and a retreating position retreating toward the movable member side;

when the movable member moves to the separating position, the adsorbing member moves to the protruding position, and the semiconductor integrated circuit adsorbed by the adsorbing member separates from pin the second conductive contact; and when the movable member moves to the contacting position, the adsorbing member moves to the retreating position, and the second external electrode of the semiconductor integrated circuit makes contact with the second conductive contact.

6. The inspection device according to claim 1, wherein the first and second conductive contact pins are equal in length, and the third conductive contact pin is longer than the first and second conductive contact pins.

7. The inspection device according to claim 1, wherein in the movable member comprises a concave receiving part having an opening in a lower part thereof; and when the movable member is in the contacting position, the fixed member is received into the receiving part of the movable member.

8. An inspection device for inspecting electric characteristics of a semiconductor integrated circuit having a first external electrode on a first surface and a second external electrode on a second surface, said first and second surfaces being opposite to each other, said inspection device comprising:

an inspection circuit board having a first electrode;

a wiring board having a second electrode, said inspection circuit board and wiring board arranged such that the first and second electrodes face each other, and the wiring board is located in a moveable member, which is moveable relative to the inspection circuit board;

a measuring device connected to the inspection circuit board;

a holding part for holding the semiconductor integrated circuit located between the inspection circuit board and the wiring board;

a first conductive contact pin for contacting the first electrode of the inspection circuit board and the first external electrode of the semiconductor integrated circuit facing the inspection circuit board, said first conductive contact pin located in a fixed member, which is fixed relative to the inspection circuit board, said first conductive contact pin being physically and electrically separable from each of the first electrode of the inspection circuit board and the first external electrode of the semiconductor integrated circuit;

a second conductive contact pin for contacting the second electrode of the wiring board and the second external electrode of the semiconductor integrated circuit facing the wiring board, the second conductive contact pin located in the movable member, said second conductive contact pin being physically and electrically separable from each of the second electrode of the wiring board and the second external electrode of such semiconductor integrated circuit;

a third electrode located on the inspection circuit board;

a fourth electrode located on the wiring board, said fourth electrode electrically connected to the second electrode via a wiring circuit located in the wiring board; and a third conductive contact pin for independently connecting the third and fourth electrodes, said third conductive contact pin located in either the movable member or the fixed member, said third conductive contact pin being physically and electrically separable from each of said third and fourth electrodes;

wherein the second and fourth electrodes are located on a planar surface of the wiring board, such that the second and fourth electrodes are located on the same plane, the moveable member is moveable to a contacting position in which the second conductive contact pin contacts the second external electrode of the semiconductor integrated circuit, the moveable member is movable to a separated position at which the second conductive contact pin is separated from the second external electrode, and the third conductive contact pin contacts the third electrode and the fourth electrode when the movable member is in the contacting position.

* * * * *